(12) United States Patent
Hayashi

(10) Patent No.: US 7,898,177 B2
(45) Date of Patent: Mar. 1, 2011

(54) LIGHT EMITTING APPARATUS

(75) Inventor: Masaki Hayashi, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/832,066

(22) Filed: Jul. 8, 2010

(65) Prior Publication Data

US 2010/0264449 A1    Oct. 21, 2010

Related U.S. Application Data

(63) Continuation of application No. 12/129,986, filed on May 30, 2008, now Pat. No. 7,777,417.

(30) Foreign Application Priority Data

May 31, 2007    (JP) .............................. 2007-146176

(51) Int. Cl.
H01J 1/62    (2006.01)
(52) U.S. Cl. ...................... 313/512; 313/506
(58) Field of Classification Search ................. 313/498, 313/506, 512
See application file for complete search history.

(56) References Cited

U.S. PATENT DOCUMENTS 7,342,357 B2    3/2008    Sakano et al.

FOREIGN PATENT DOCUMENTS

| JP | 10-144965 | 5/1998 |
|---|---|---|
| JP | 2005-259972 | 9/2005 |
| JP | 2005-353914 | 12/2005 |
| JP | 2006-49442 | 2/2006 |
| JP | 2006-93697 | 4/2006 |
| JP | 2006-156704 | 6/2006 |

*Primary Examiner*—Vip Patel
(74) *Attorney, Agent, or Firm*—Ditthavong Mori & Steiner, P.C.

(57) ABSTRACT

A light emitting apparatus includes a light emitting device mounted on a base. First and second leads are electrically connected to the light emitting device. A first resin molding member formed of thermosetting resin covers at least partially the base and the first and second leads so that the first resin molding member is formed integrally with the base and the first and second leads. A second resin molding member formed of thermosetting resin is in contact with at least a part of the first resin molding member and covers the light emitting device. A recessed portion is formed in the first resin molding member on a light emitting device mount surface side of the base to open upward and to have a side surface. A protection device is mounted on the first lead or the second lead. The protection device is covered by the first resin molding member.

12 Claims, 15 Drawing Sheets

PRIOR ART

LIGHT EMITTING APPARATUS

CROSS-REFERENCE TO RELATED APPLICATION

The present application is a continuation application of the U.S. patent application Ser. No. 12/129,986 filed May 30, 2008, which claims priority to Japanese Patent Application Number 2007-146176, filed May 31, 2007. The contents of these applications are incorporated herein by reference in their entirety.

BACKGROUND OF THE INVENTION

1. Field of the Invention

The present invention relates to a light emitting apparatus.

2. Description of the Related Art

In recent years, high power and light emission efficiency improvement are required for light emitting apparatuses that include a semiconductor light emitting device. For this reason, a current is increased that is applied to the device. Also, the number of the semiconductor light emitting devices is increased. Also, the light emission area of the semiconductor light emitting device is increased. These measurements are made to increase the light power of light source itself. Also, a light emitting apparatus has been developed that eliminates factors of optical loss to increase the light outgoing amount of the light emitting apparatus as a whole (for example, Japanese Patent Laid-Open Publication No. 2006-93697). With reference to FIGS. 31-33, an exemplary light emitting apparatus is shown that has structure capable of suppressing absorption of light emitted from a light source by an electrostatic discharge shock protection device. FIG. 31 is a cross-sectional view showing a light emitting apparatus 100 that includes a plurality of semiconductor light emitting devices 104. FIG. 32 is a cross-sectional view showing the light emitting apparatus 100 taken along the line XXXII-XXXII' in FIG. 31. FIG. 33 is a cross-sectional view of the light emitting apparatus 100 taken along the line XXXIII-XXXIII' line in FIG. 31.

As shown in FIGS. 31 and 32, the light emitting apparatus 100 includes a lead frame 103 that includes a pair of cathode lead 101 and anode leads 102 that are spaced away from each other. The plurality of semiconductor light emitting devices 104 are mounted on the cathode lead 101. An electrostatic discharge shock protection element 105 is mounted on the anode lead 102. As shown in FIGS. 31 and 33, a recessed area forming portion 106 covers most part of the lead frame 103 except the semiconductor light emitting devices 104, and forms recessed areas by wall surfaces of the recessed area forming portion 106 that surround the peripheries of the device 104. That is, the semiconductor light emitting device 104 is mounted on the bottom surface of the interior of each of the recessed areas that opens in a generally stepped shape. The electrostatic discharge shock protection device 105 is embedded in a wall of the recessed area forming portion 106. The recessed area forming portion 106 is formed of a white $TiO_2$ group thermosetting resin material by molding. $SiO_2$ glass fills the recessed areas of the recessed area forming portion 106.

In the case of the thus-configured light emitting apparatus 100, since the electrostatic discharge shock protection device 105 is embedded in the recessed area forming portion 106, the electrostatic discharge shock protection device 105 is not externally exposed. For this reason, light emitted from the semiconductor light emitting device 104 does not travel to the electrostatic discharge shock protection device 105. Accordingly, it can be prevented that the outgoing light is partially absorbed by the electrostatic discharge shock protection device 105. Also, it can be suppressed that the emitted light is reflected by the electrostatic discharge shock protection device 105, and that the light travels in an undesired direction. As a result, it is possible to increase the light outgoing efficiency of the apparatus as a whole, and to provide a light emitting apparatus with high illumination.

However, in recent years, the output of light emitting device is remarkably increased. In particular, in a light emitting apparatus that includes a light emitting device capable of emitting short wavelength light or blue group light, as the output of light emitting device is further increased, heat is getting increased that is generated from a wavelength conversion member that can convert the wavelength or an excitation light source, or the light source itself. This may cause problem in that the characteristic of device deteriorates. In addition to this, this may cause a crack of a member or the like, and may reduce the reliability of apparatus. As shown in particular in FIG. 31, in the case of the apparatus that is configured to mount a plurality of devices only one of anode and cathode leads, the heat amount in the apparatus is likely to be unevenly distributed. In this case, if heat is not sufficiently dispersed from and is stored in a member, the member is subjected to stress caused by the difference of the thermal expansion coefficients between parts. In particular, stress is likely to occur on the boundary between different members. For this reason, a crack is likely to appear on the boundary. Accordingly, in the light emitting apparatus that is configured to form the recessed area forming portion that is formed of resin by molding and holds a member that is formed of a material different from the recessed area forming portion and is embed in the recessed area forming portion as shown in FIG. 31, there is a problem in that a crack is likely to appear on the boundary between the members formed of different materials. In addition to this, for the increase of light amount, the recessed area forming portion is required to be improved in light resistance and heat resistance.

SUMMARY OF THE INVENTION

According to one aspect of the present invention, a light emitting apparatus includes a light emitting device, a base, a first lead and a second lead, a first resin molding member, and a second resin molding member. The base is provided with the light emitting device mounted thereon. The first lead and the second lead are electrically connected to the light emitting device. The first resin molding member is formed of resin that covers at least partially the base and the first lead and the second lead so that the first resin molding member is formed integrally with the base and the first lead and the second lead. The second resin molding member is in contact with at least a part of the first resin molding member and covers the light emitting device. The first and second resin molding members are formed of a thermosetting resin material. A recessed portion is formed in the first resin molding member on a light emitting device mount surface side of the base to open upward and to have a side surface. A protection device is mounted on the first lead or the second lead. The protection device is covered by the first resin molding member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT(S)

Figure 1:
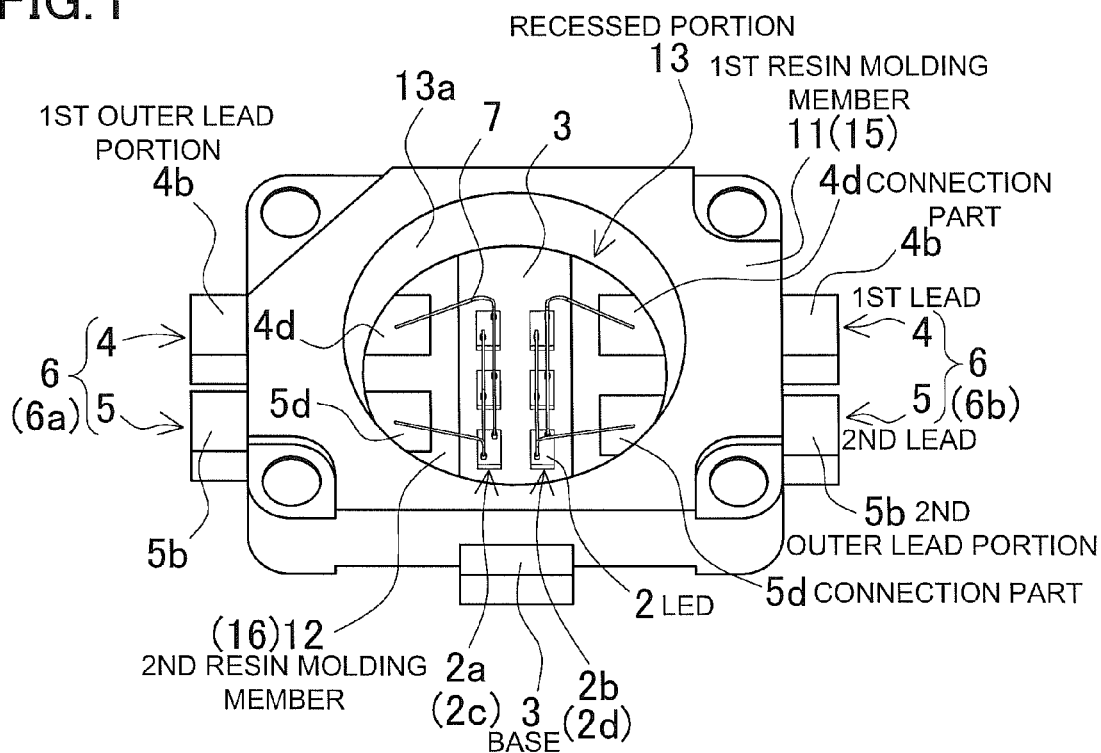
FIG. 1 is a perspective view schematically showing a light emitting apparatus according to a first embodiment.

A semiconductor light emitting apparatus according an embodiment of to the present invention can be configured so that a base 3 is at least partially exposed in a bottom surface area of a recessed portion 13 in a first resin molding member 11, and light emitting devices 2 are mounted in the exposed part of the base 3.

In the semiconductor light emitting apparatus, it is preferable that the base 3 and connection parts 4$d$ and 5$d$ of first and second leads 4 and 5 are spaced away and are insulated from each other.

In the semiconductor light emitting apparatus, the base 3 is at least partially exposed from the first resin molding member 11 on a back surface of the base 3 opposite to the mount surface on which light emitting devices 2 are mounted.

In the semiconductor light emitting apparatus, the first and second leads 4 and 5 are at least partially exposed from the first resin molding member 11 on back surfaces of the first and second leads 4 and 5 opposite to mount surfaces of the first and second leads 4 and 5 that are electrically connected to the light emitting device 2.

In the semiconductor light emitting apparatus, at least two of the exposed portions of the back surfaces of the base 3 and the first and second leads 4 and 5 are arranged coplanar with each other.

In the semiconductor light emitting apparatus, thermally conductive heat dissipation members 20 are at least partially coupled onto the exposed portions of the back surfaces of the base 3 and the first and second leads 4 and 5.

In the semiconductor light emitting apparatus, the first resin molding member 11 is formed by transfer molding.

In the semiconductor light emitting apparatus, the first resin molding member 11 is formed of at least one material selected from the group consisting of epoxy resin, denatured epoxy resin, silicone resin, denatured silicone resin, acrylate resin, urethane resin, and polyimide resin.

In the semiconductor light emitting apparatus, the first resin molding member 11 contains at least one material selected from the group consisting of filler, diffusion material, pigment, fluorescent material, reflexive material, light shielding material, ultraviolet absorption material, antioxidant material, and mold release agent.

In the semiconductor light emitting apparatus, the second resin molding member 12 contains at least one material selected from the group consisting of filler, diffusion material, pigment, fluorescent material, reflexive material, ultraviolet absorption material, and antioxidant material.

In the semiconductor light emitting apparatus, protection devices 14 are mounted on the first or second leads 4 and 5, and the protection devices 14 are covered by the first resin molding member 11.

In a resin molding device according to the embodiment of the present invention, the base 3 is insulated from the first and second leads 4 and 5.

In the resin molding device, the base 3 is at least partially exposed on the back surface of the base 3 opposite to the mount surface.

In the resin molding device, the first and second leads 4 and 5 are at least partially exposed on back surfaces of the first and second leads 4 and 5 opposite to mount surfaces of the first and second leads 4 and 5 that can be electrically connected to the light emitting device 2.

In the resin molding device, at least two of the exposed portions of the back surfaces of the base 3 and the first and second leads 4 and 5 are arranged coplanar with each other.

In the resin molding device, thermally conductive heat dissipation members 20 is at least partially connected onto the exposed portions of the back surfaces of the base 3 and the first and second leads 4 and 5.

In the resin molding device, the resin molding member is formed by transfer molding.

In the resin molding device, the resin molding member is formed of at least one material selected from the group consisting of epoxy resin, denatured epoxy resin, silicone resin, denatured silicone resin, acrylate resin, urethane resin, and polyimide resin.

In the resin molding device, the resin molding member contains at least one material selected from the group consisting of filler, diffusion material, pigment, fluorescent material, reflexive material, light shielding material, ultraviolet absorption material, antioxidant material, and mold release agent.

In the resin molding device, protection devices 14 are mounted on the first or second leads 4 or 5, and the protection devices 14 are covered by the first resin molding member 11.

In a production method of a light emitting apparatus according to the embodiment of the present invention, protection devices are mounted on the upper surfaces of the first or second leads 4 or 5 prior to a first step.

According to the aforementioned light emitting apparatus, the aforementioned resin molding device, the aforementioned production method of a light emitting apparatus, and the aforementioned production method of a resin molding device, the layout of base, and the first and second leads, as well as other members is brought close to a symmetrical layout. Accordingly, the characteristics such as heat amount that is generated by the thus-arranged light emitting device can be uniform. As a result, it is prevented that the heat is unevenly stored. Therefore, it is possible to improve the reliability of the device. The reason is that heat that can be generated in the light emitting devices is conducted to the base that is arranged directly under the light emitting devices, and is then generally symmetrically and diffusively conducted to the leads. For this reason, generated heat is generally radially conducted from the base and the light emitting devices that are located in the central part of the light emitting apparatus to the sets of the lead pairs that are generally symmetrically arranged on sides of the light emitting apparatus. Thus, the heat is not unevenly stored in the leads, and can be generally evenly dispersed. Consequently, it is possible to provide a light emitting apparatus and a resin molding device that have excellent heat resistance and are tough.

Also, according to the light emitting apparatus, the resin molding device, and the production method of a light emitting apparatus according to other aspects of the present invention, since the protection device can be covered by and embedded in the first resin molding member, it can be prevented that the protection device absorbs light emitted from the light emitting device. That is, it is possible to provide a light emitting apparatus that has reduced light loss and high power. In addition to this, since the resin molding member and the light emitting apparatus have a close-to-symmetrical arrangement, it can be prevented that stress occurs caused by the difference of the thermal expansion coefficients of the first resin molding member and a different material member that is embedded in the first resin molding member in the boundary between the first resin molding member and the different material member. Therefore, it is possible to provide a light emitting apparatus that has long life and high reliability.

Also, according to the light emitting apparatus and the resin molding member according to other aspects of the present invention, since the base and/or the lead include(s) exposed portions that are exposed from the first resin molding member, a heat dissipation effect can be provided. In addition to this, since the lead and the base are configured to be spaced away from each other, the lead and the base can be formed of different materials. That is, the base, which is located close to the heat source, can be formed of a selected material, or the base can be connected to a separate heat dissipation member so that heat is more intensively dispersed from the base. Accordingly, it is possible to remarkably suppress that heat is stored in the apparatus. As a result, in the boundary between members, it is possible to remarkably suppress that stress occurs caused by the difference between the thermal expansion coefficients of the members. Therefore, it is possible to suppress a crack, which is likely to occur near the boundary between the different material members. That is, the light emitting apparatus can have high reliability and can be tough, and improvement of heat dissipation characteristics results in increase of the number of the light emitting devices that can be installed in the light emitting apparatus. Therefore, a high luminance, high power light emitting apparatus can be expected.

Also, in the case where a plurality of sets of the lead pairs each of which is composed of a pair of terminals are arranged on sides of the base that is located in the central part of the light emitting apparatus, it is possible to provide a plurality of electrical paths through which electric power is provided to the light emitting devices. The light emitting devices are arranged in a plurality of rows as light emitting device groups. The light emitting device groups can be electrically connected to the sets of the lead pairs in parallel. In this case, the wire-bonding pattern of the light emitting devices can be simple. Therefore, a short circuit can be prevented.

Also, according to the light emitting apparatus, the resin molding device, the production method of a light emitting apparatus, and the production method of a resin molding device according to other aspects, the resin molding member is formed of a thermosetting resin material. In this case, it is possible to prevent peeling of the first and second resin molding members at the boundary between the first and second resin molding members. The reason is that, dissimilar to thermoplastic resin, thermosetting resin has many reactive functional groups. Accordingly, the first and second resin molding members can provide a firm bonding boundary. In the case where the second resin molding member is formed of a thermosetting resin material, the second resin molding member can have isotropic thermal expansion similarly to the first resin molding member. Accordingly, it is possible to further reduce thermal stress at the bonding boundary due to temperature variation. In the case where the second resin molding member is formed of a thermosetting resin material similar to the first resin molding member, in addition to improvement of the bonding by the reduction of boundary tension, it is possible to provide very firm intimate bonding characteristics. The reason is that curing reaction is advanced at the boundary. As for light resistance, since the composition of three-dimensionally cross-linked thermosetting resin can be changed without reduction of heat resistance, it is possible to easily eliminate an aromatic component that is very poor light resistance. In the case of thermoplastic resin, an aromatic component actually directly relates to heat resistance. In the case of thermoplastic resin, a molding member that is available for reflow soldering cannot be provided without an aromatic component. For this reason, in the case where the first and second resin molding members are formed of a thermosetting resin material, it is possible to provide a light emitting apparatus that has an essentially firm bonding boundary, is less likely to deteriorate due to light, has excellent peeling resistance, and is less likely to deteriorate due to aging.

Also, according to the light emitting apparatus and the resin molding device according to other aspects of the present invention, in the case where the resin molding member is formed from low viscous thermosetting resin by transfer molding, as compared with injection molding, the molding member can be accurately formed which has a complicated shape. In addition, in the case where the protection device and an electrically conductive member to be embedded in the recessed portion are covered by resin after mounted in the recessed portion, if the viscosity of resin is high, stress by the resin may be applied to the electrically conductive member. In this case, the electrically conductive member may be disconnected. However, in the case where low viscous thermosetting resin is used, it is possible to suppress the disconnection.

Also, according to the light emitting apparatus according to another aspect of the present invention, when light emitted from the light emitting devices travel toward the resin molding member, the light can be reflected or scattered. Accordingly, it is possible to emit light with reduced color unevenness. Also, in the case where the wavelength of light emitted from a light source can be converted, it is possible to provide a light emitting apparatus that includes a light emitting device that emits high power light in a predetermined color range. In addition, in the case where a light source with a predetermined peak wavelength is selectively installed, the light emitting apparatus can emit desired color light at high efficiency. Therefore, the available wavelength width of the light emitting apparatus is increased. In the aforementioned light emitting apparatus, work in manufacturing process can be easy, and it is possible to provide a light emitting apparatus that has excellent weather resistance.

Also, according to the light emitting apparatus and the resin molding device according to other aspects of the present invention, the light emitting apparatus or the resin molding device can be stable in installation.

First Embodiment

Configuration

Figure 2:
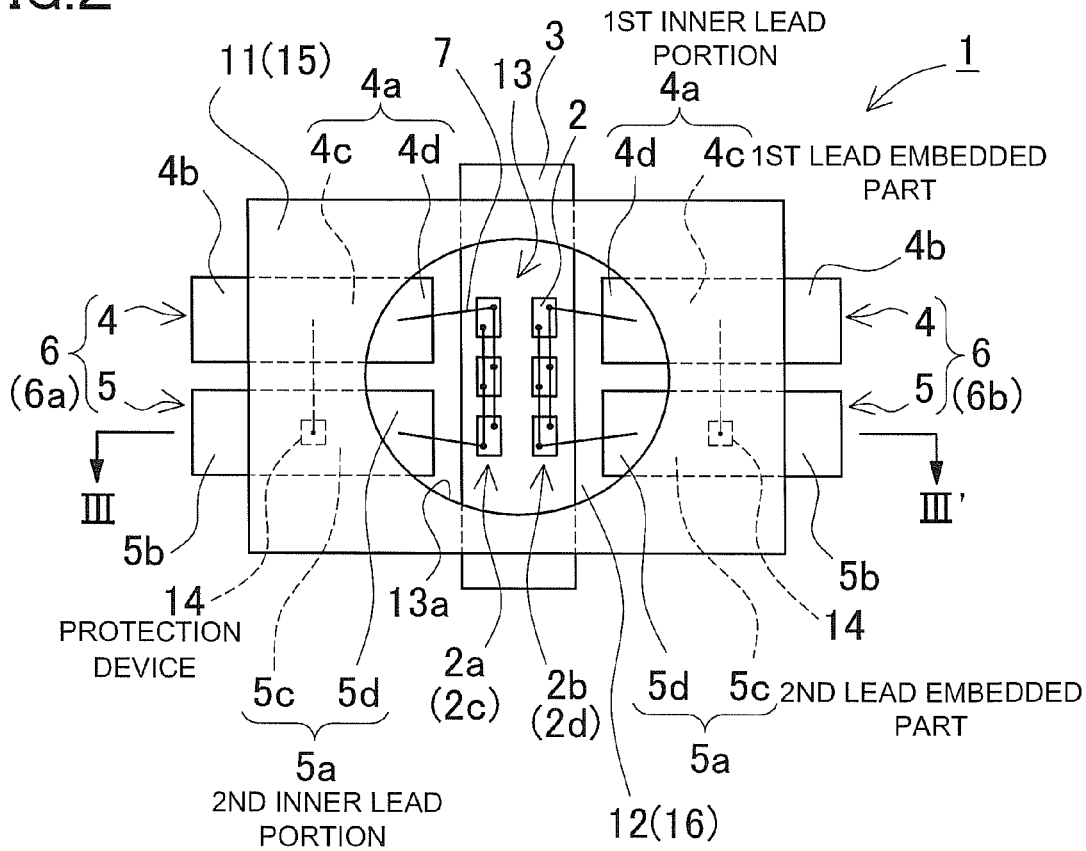
FIG. 2 is a plan view schematically showing the light emitting apparatus according to the first embodiment.
Figure 3:
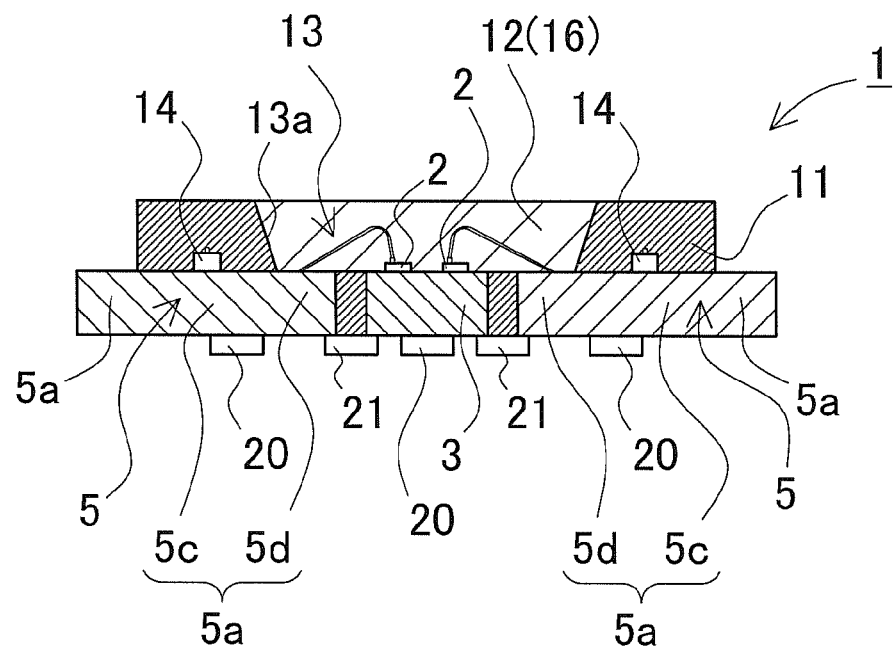
FIG. 3 is a cross-sectional view schematically showing the light emitting apparatus according to the first embodiment.
Figure 4:
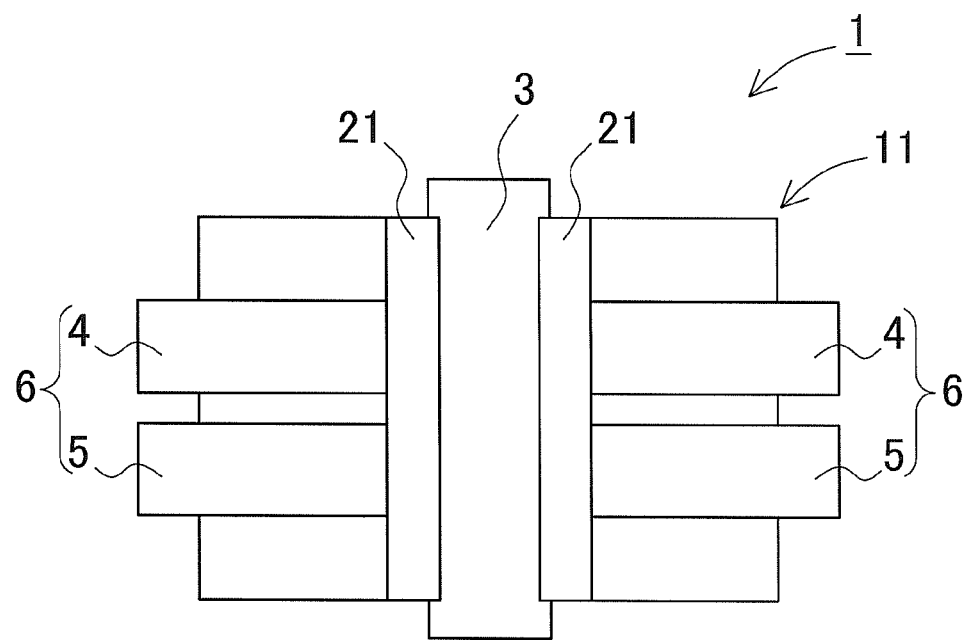
FIG. 4 is a bottom view schematically showing the light emitting apparatus according to the first embodiment.

FIG. 1 is a perspective view schematically showing a light emitting apparatus according to a first embodiment. FIG. 2 is a plan view schematically showing the light emitting apparatus. FIG. 3 is a cross-sectional view schematically showing the light emitting apparatus taken along the line III-III' in FIG. 2. FIG. 4 is a bottom plan view schematically showing the light emitting apparatus. The illustrated light emitting apparatus 1 mainly includes a plurality of the light emitting devices 2, the first resin molding member 11, and the second resin molding member 12. The light emitting devices 2 are installed in a resin molding device that is composed of the first resin molding member 11. The second resin molding member 12 covers the light emitting devices 2.

As shown in FIGS. 1 to 4, a plurality of the first and second leads 4 and 5 are spaced away and isolated from each other on both sides of the base 3. The first and second leads 4 and 5, and the base 3 are insulated from each other. The base 3, and the first and second leads 4 and 5 are embedded in a first thermosetting resin member 15. Thus, the base 3, the first and second leads 4 and 5, and the first thermosetting resin member 15 are integrally formed to form the first resin molding member 11 as the resin molding device. The upper surfaces of the base 3, and the first and second leads 4 and 5 are extends in the generally horizontal direction. The recessed portion 13 is formed on the upper side of the base 3. The recessed portion 13 has a side surface, and opens upward in a generally stepped shape. The opening of the recessed portion 13 is filled with a second thermosetting resin member 16. Thus, the second resin molding member 12 is formed.

Each of the base 3, and the first and second leads 4 and 5 has the upper surface as a light emitting device 2 mount surface side, and the back surface opposite to the upper surface. At least parts of the upper and back surface are exposed from the first resin molding member 11. Specifically, as shown in FIGS. 1 to 3, in the bottom surface area of the recessed portion 13, parts of the first and second leads 4 and 5 are exposed from the first resin molding member 11. As shown in FIG. 4, on the back surface side of the light emitting apparatus 1, at least parts of the back surface areas of the base 3, the first and second leads 4 and 5 are externally exposed. The members will be described in more detail.

Base

A plurality of the light emitting devices 2 are mounted on the upper surface of the base 3. The light emitting devices 2 can be heat sources. For this reason, it is preferable that the base 3 that located near the light emitting devices 2 is formed of a material with excellent thermal conductivity, and is configured to be able to disperse heat outward. Examples that can be used as such a material with excellent thermal conductivity can be provided by copper, copper alloy, and aluminum. In addition to this, in order to increase reflection characteristics for light from the light emitting devices 2, the surface of the base 3 can be plated with metal such as silver, aluminum, copper, and gold. However, the base 3 may be formed of the material same as the leads 4 and 5. The material of the leads 4 and 5 will be described later. In this case, the base and the leads that serve as the frame of the light emitting apparatus 1 can be formed in the same process. Accordingly, the forming process of the base and the leads can be simplified. In this case, the surface of the base can be coated by a sheet of resin with excellent thermal conductivity to further provide a heat dissipation effect, for example.

The base 3 can have a shape the upper surface of which is provided with a plurality of the light emitting devices 2 that are aligned in a plurality of rows. The shape of the base 3 is specifically not limited. The base 3 can have a plate-shaped cylindrical shape, a generally rectangular parallelepiped and a generally cubic shape, and may have a recessed part. In addition to this, the base 3 preferably has a smooth upper surface. In this case, the light emitting devices 2 can be stably mounted, and additionally the reflectivity of the upper surface of the base can be improved. In addition to this, a surface other than the main surface side on which the light emitting device 2 is mounted, for example, the back surface side of the base 3 is externally exposed. In this case, it is possible to provide more effect on heat dissipation. In addition to this, the base 3 can have a shape that has continuously uneven parts with height difference such as protruding and recessed parts on the back surface area. In this case, the surface area of the base can be increased that is in contact with outside air. Accordingly, it is possible to provide more effect on heat dissipation.

In the case where the area of the upper surface of the base 3 is large, the stability of the devices in installation is increased. Also, the number of devices is increased that can be mounted on the upper surface of the base 3. Also, the heat dissipation characteristics of the base 3 are increased. Also, electric power that is applied to the devices can be increased. As for the thickness direction, in the case where the thickness of the base 3 is large, the heat dissipation characteristics of the base 3 are increased. In addition to this, the distortion of the base 3 is reduced. Also, the stability of the light emitting devices 2 when mounted is increased. Also, the directivity of light emitted from the light emitting devices 2 is improved. Accordingly, it is possible to provide a highly reliable light emitting apparatus. On the other hand, in the case where the base 3 is thin, the light emitting apparatus can be thin as a whole.

In the light emitting apparatus 1 shown FIG. 4, the whole surfaces of the base 3, and the first and second leads 4 are exposed on the back surface side to provide a heat dissipation effect. However, the whole surfaces of the base 3, and the first and second leads 4 are not necessarily exposed on the back surface side. For example, portions of surfaces of the base 3, the first and second leads 4 may be exposed that are required to suppress burr appearance. In this case, since the exposed portions of the leads are separated by resin, for example, it is possible to suppress a short circuit between the leads 4 and 5 caused by deviation of solder or the like. Also, it is preferable that at least two of the exposed portions of the back surfaces of the base 3 and the first and second leads 4 and 5 are arranged coplanar with each other. In this case, the light emitting apparatus or the resin molding device can be easily installed.

As for the exposed portions of the first and second leads 4 and 5 are preferably arranged generally coplanar with each other on the back surface side. In this case, the stability of the light emitting apparatus 1 in installation can be increased. Since the exposed portions are arranged coplanar with each other, the light emitting apparatus 1 can be sufficiently installed on plate-shaped external terminals by using solder. Accordingly, it is possible to improve installation workability of the light emitting apparatus. In addition to this, the light emitting apparatus or the resin molding device can be very easily formed by dies.

A heat dissipation member such as a heat dissipation fin may be arranged to be in contact with the exposed portion of the base 3 on the back surface side. The heat dissipation member can be arranged as a separate member from the light emitting apparatus 1. Alternatively, the heat dissipation member can be arranged integrally with the light emitting apparatus 1. The heat of the base that is arranged near the heat source can be directly conducted to the heat dissipation member, and can be dispersed externally. Accordingly, it is possible to provide more effect on heat dissipation effect. In the case where the heat dissipation member is arranged as a separate member, the light emitting apparatus 1 can be easily arranged at an installation position. In the case where an insulating heat dissipation member is used, or in the case where a heat dissipation member is arranged to interpose an insulating member between the base 3 and the sets of the lead pairs 6 on the sides, a heat dissipation member with a large area can be arranged to extends over the base 3 and the sets of the lead pairs 6 on the sides.

First Resin Molding Device

Spacing areas between the aforementioned base 3, and the aforementioned leads 4 and 5 are filled with the first thermosetting resin member 15 to be coupled integrally to each other. Accordingly, the integrally coupled members form the first resin molding device. As shown in FIG. 1, the first resin molding member 11 as the first resin molding device has the recessed portion 13 on the light emitting device 2 mount surface side of the base 3. The recessed portion 13 opens upward in a generally stepped shape. The opening of the recessed portion 13 is getting wider toward an opening direction. The light emitting devices are mounted in the bottom surface area of the recessed portion 13. The recessed portion 13 has a side surface 13*a* that is connected to the upper surface of the base 3 at a generally right angle or an obtuse angle. Accordingly, light emitted from the light emitting devices 2 can be reflected to efficiently outgo in the forward direction. The inclination angle of the side surface 13*a* can be determined relative to the upper surface of the base 3 based on a desired light traveling direction. The inclination angle of the side surface 13*a* is preferably not less than 95° and not more than 150°, and is more preferably not less than 100° and not more than 120°. In this case, it is possible to improve the light outgoing efficiency from the light emitting devices 2. Note that the inclination may be not eliminated. The recessed portion 13 may have a cylindrical shape. In the case where the recessed portion 13 is covered on the internal surface side by a reflective metal material such as silver, aluminum, copper and gold, it is possible to increase the reflectivity of the recessed portion 13, and to increase the light outgoing efficiency. The inclined surface is preferably smooth. However, unevenness may be provided on the inclined surface. In this case, it is possible to improve tight bonding characteristics between the recessed portion 13 and the later-described the second resin molding member 12, and it is possible to improve the reliability of the light emitting apparatus. The opening of the recessed portion 13 is filled with this second resin molding member 12. The recessed portion 13 preferably has a continuous side surface that surrounds the light emitting devices on all sides. However, the recessed portion 13 may have connected side surfaces or only two pairs of side surfaces that are opposed to each other. The material and the shape of the first resin molding member 11 are suitably selected to efficiently reflect light of the light emitting devices 2. Specifically, the material of the first resin molding member 11 reflects preferably not less than 30% of the light from the light emitting devices 2, more preferably not less than 50% of the light, and most preferably not less than 70% of the light. Also, the reflectivity of the material of the first resin molding member 11 for 460 nm light is preferably is not less than 50%, and more preferably not less than 70%.

Shape

The recessed portion 13 in the first resin molding member 11 can have a shape in that a plurality of light emitting devices 2 are mounted on the bottom surface side of the recessed portion 13, and in that light from the light emitting devices 2 is uniformly emitted in the frontward direction. The shape of the recessed portion 13 on the bottom surface side is not specifically limited. The opening of the recessed portion 13 shown in FIG. 1 is a generally ellipse shape. However, the opening of the recessed portion 13 can be any shape such as such as a circle, an ellipse, a rectangular, and a polygon. For example, the light emitting devices 2 are mounted in the central area of the bottom of the recessed portion 13 so that the distances between the light emitting devices and the side surface 13a of the recessed portion 13 are uniform. In this arrangement, light from a light source is incident at a uniform light amount upon the side surface of the recessed portion 13 in the peripheral direction of the recessed portion 13. In this case, the light emitting apparatus 1 can uniformly emit light. Accordingly, it is possible to reduce light unevenness. The outline shape of the recessed portion 13 shown in FIG. 1 in a plan view when viewed from the main light emission surface side, that is, the outline shape of the first resin molding member 11 is a generally rectangular shape. However, the outline shape of the first resin molding member 11 is not limited to this. For example, the outline shape of the first resin molding member 11 can be any shape such as a circle, an ellipse and a polygon. Also, the cross-sectional shape of the first resin molding member 11 can be any shape such as a rectangular, a tapered shape that has an upper surface larger than a bottom surface, and an inversely-tapered shape. In consideration of light outgoing efficiency, the cross-sectional shape of the first resin molding member 11 is preferably an inverted, truncated cone shape that has an upper surface larger than a bottom surface. A mark such as a cathode mark or the like is arranged in a predetermined place if necessary. This can improve work efficiency, and yields.

Bottom Surface Area of Recessed Portion

In the opening bottom surface area in the recessed portion 13, the upper surface of the base 3 is partially exposed. The aforementioned light emitting devices 2 are mounted in this exposes area to be aligned in a plurality of rows, for example. Accordingly, heat that is generated from the light emitting devices 2 can be dispersed outward through the thermally conductive base 3. However, the upper surface of the base 3 in the bottom surface area of the recessed portion 13 is not necessarily exposed. The upper surface of the base 3 may be partially or entirely covered by the first thermosetting resin member 15. That is, the first thermosetting resin member 15 can be connected to thermosetting resin that is located on the sides of the base 3 by cross-linking. Accordingly, the first thermosetting resin member 15 can be formed firmly and integrally with the base 3 and the sets of the lead pairs 6. Therefore, it is possible to provide a tough the first resin molding member 11 as the resin molding device. In addition to this, the insulation between the leads can be improved. Therefore, it is possible to suppress a short circuit in the apparatus. In the case where the base 3 is covered by the first thermosetting resin member 15, the devices are mounted on the part of the thermosetting resin member 15 that is located directly above the base 3. That is, the devices 2 are mounted in a generally central part of the apparatus. Heat that is generated from the devices 2 that can be heat sources is conducted to the base 3 that is located near the devices 2, and can be radially emitted. Accordingly, the heat can be uniformly dispersed in the light emitting apparatus. As a result, it is possible to suppress stress that occurs caused by the difference between the expansion coefficients of members. Consequently, it is possible to prevent that a crack occurs in the apparatus.

Material

The first resin molding member 11 is formed of a thermosetting resin material. The resin molding member is preferably formed of at least one material selected from the group consisting of epoxy resin, denatured epoxy resin, silicone resin, denatured silicone resin, acrylate resin, and urethane resin among thermosetting resins. Among the resins, the resin molding member is preferably formed of epoxy resin, silicone resin, and denatured silicone resin. In particular, an epoxy resin is preferable. In this case, it is possible to provide a light emitting apparatus that has excellent heat resistance, light resistance, bonding characteristics, and mass-producibility. As compared with a thermoplastic resin, since a thermosetting resin is used, it is possible to reduce the deterioration of the first resin molding member 11. Therefore, the life of the light emitting apparatus can be longer.

Specifically, for example, epoxy resin is prepared that contains triglycidylisocyanurate (chemical formula 1), hydrogenated bisphenol A diglycidyl ether (chemical formula 2), and so on. Acid anhydride is prepared that contains hexahydrophthalic anhydride (chemical formula 3), 3-methylhexahydrophthalic anhydride (chemical formula 4), 4-methylhexahydrophthalic anhydride (chemical formula 5), and so on. The acid anhydride is mixed at equivalent weight relative to the epoxy resin with the epoxy resin to form a transparent mixture. The transparent mixture of 100 parts by weight is added with DBU (1,8-Diazabicyclo(5,4,0)undecene-7) (chemical formula 6) of 0.5 part by weight as a curing accelerating agent, ethylene glycol (chemical formula 7) 1 part by weight as a promoter, titanium oxide pigment of 10 parts by weight, and glass fiber of 50 parts by weight. The mixture is heated so that curing reaction partially advances to produce B-stage solid epoxy resin products. The thus-produced B-stage solid epoxy resin products can be used as the material of the first resin molding member 11.

In the case where the above thermosetting resin is used, the bonding characteristics can be improved between the base 3, and the leads 4 and 5. Accordingly, it is possible to provide a stable light emitting apparatus. In addition to the tight bonding characteristics between the first resin molding member and the second resin molding member that is filled in the recessed portion 13, light resistance and heat resistant are improved. Accordingly, it is possible to suppress a crack, which is likely to occur in the boundary part between the both members caused by heat. In the case where low viscous thermosetting resin is used, even a small gap between the protection device and a member can be filled with the resin. Accordingly, the protection device can be stably embedded in the first resin molding member 11. Since the thermosetting resin has low viscosity, it is possible to reduce stress that is applied to members that come in contact with the resin in the recessed portion 13. Therefore, for example, it is possible to suppress insulation caused by disconnection of wire lines 7.

[Chemical Formula 1]

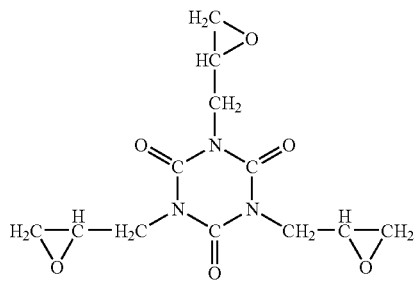

-continued

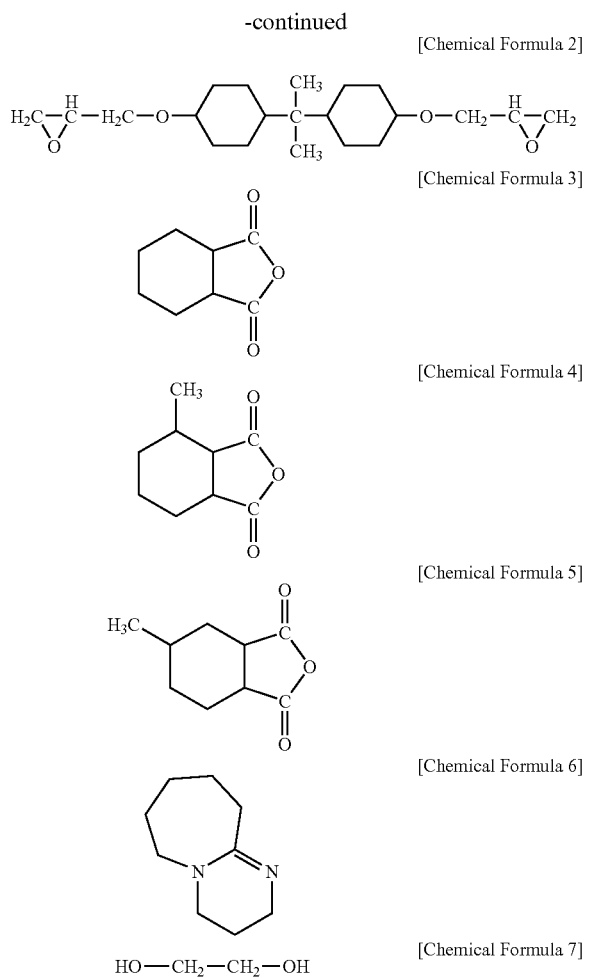

[Chemical Formula 2]

[Chemical Formula 3]

[Chemical Formula 4]

[Chemical Formula 5]

[Chemical Formula 6]

[Chemical Formula 7]

HO—CH$_2$—CH$_2$—OH

Additives

Since the first resin molding member 11 serves as a package that surrounds members such as the light emitting devices 2, the first resin molding member 11 is a preferably a hard member. Although the first resin molding member 11 can be either transparent or non-transparent, the first resin molding member 11 can be suitably formed depending on the uses and the like. For example, the light blocking effect material can be mixed into the first resin molding member 11. In this case, it is possible to reduce light that passes through the first resin molding member 11. Also, a filler or a diffusion material can be mixed to uniformly emit light from the light emitting apparatus 1 mainly in the forward direction and the side directions. Also, in order to reduce absorption of light, not dark color pigment but white group pigment can be added. Also, in order to relieve thermal stress of resin, various types of fillers such as aluminum nitride, aluminum oxide and mixture compound of them can be mixed. In order for the first resin molding member 11 to have certain functions, the first resin molding member 11 can be mixed with at least one material selected from the group consisting of filler, diffusion material, pigment, fluorescent material, reflexive material, light shielding material, ultraviolet absorption material, antioxidant material, and mold release agent. Various types of materials can be added to the first resin molding member 11 depending on the type of the first resin molding member 11. For example, a highly transparent material is used for the first resin molding member 11, and additionally a fluorescent material can be mixed in the highly transparent material. In this case, the fluorescent material absorbs light emitted toward the side surface sides or the bottom surface side of the light emitting device 2, and converts the wavelength of the absorbed light. Accordingly, the light emitting apparatus can provide desired light emission color as a whole. For example, in order to uniformly diffuse emitted light, a filler, a diffusion material, a reflexive material, a reflective material, and the like can be added on the side surface sides or the bottom surface side of the light emitting device 2. For example, in order to reduce light that outgoes from the back surface side of the light emitting apparatus, light shielding resin can be mixed in the highly transparent material. Specifically, in the first resin molding member 11, titanium oxide, silica, and alumina are preferably mixed in epoxy resin. In this case, it is possible to provide a light emitting apparatus that has excellent heat resistance.

Lead

In the light emitting apparatus 1 shown in FIGS. 1 to 4, two sets of the lead pairs 6 are arranged generally symmetrically with respect to the base 3. Each lead pair 6 is composed of the first lead 4 and the second lead 5. The first and second leads 4 and 5 are a pair of, positive and negative terminals. Specifically, the first lead is a cathode or an anode, and the second lead is a terminal corresponding to a polarity opposite to the first lead, i.e., an anode or a cathode (preferably, the first lead is a cathode, and the second lead is an anode). The leads are connected to external terminals. Thus, the light emitting devices 2 can be provided with electric power.

Explanation of Parts in Lead

The lead pair 6 is composed of the first lead 4 and the second lead 5. The first lead 4 and the second lead 5 correspond to polarities opposite to each other, and are insulated from each other. The first lead 4 and the second lead 5 are spaced away from each other, and are arranged in generally parallel. Even in the case where one of the leads is coupled to the base 3, the light emitting apparatus can operate (can emits light). However, heat distribution is localized in the lead on which the devices are mounted. Localized high temperature may cause low reliability of apparatus. Accordingly, in terms of uniform heat distribution, the leads 4 and 5 are preferably spaced away from the base 3. Specifically, in the light emitting apparatus 1 shown FIG. 1, the leads are spaced away from the base 3, and are arranged generally symmetrically with respect to the base 3. Accordingly, it is possible to uniformly distribute heat of the base that is located near the light emitting devices 2 that can be a heat source, and to suppress uneven distribution of heat that is stored in the light emitting apparatus. Therefore, it is possible to highly efficiently disperse the heat. Also, at least parts of the base 3, and the leads 4 and 5 are externally exposed in the bottom surface area of the recessed portion 13. A plurality of the light emitting devices 2 are mounted on the exposed base 3. The light emitting devices 2 are electrically connected to connection parts 4d and 5d of the first lead 4 and the second lead 5 that are exposed in the bottom surface area of the recessed portion 13.

The leads 4 and 5 have first and second embedded parts 4c and 5c that are located near the connection parts 4d and 5d, and are covered by the first thermosetting resin member 15. Areas that include the embedded parts 4c and 5c, and the connection parts 4d and 5d are referred to as first and second inner lead portions 4a and 5a, for ease of explanation. Note that however the areas are designated as the first and second inner lead portions 4a and 5a but the first and second inner lead portions 4a and 5a are not members separated from the first and second leads 4 and 5. Also, areas that extend outward of the first resin molding member 11 from the inner lead portions 4a and 5a, and are area exposed externally are referred to as first and second outer lead portions 4b and 5b, respectively. Areas of the leads 4 and 5 that are exposed on the back surface side are occasionally referred to as the first and second outer lead portions 4b and 5b.

The first and second outer lead portions 4b and 5b on the back surface side are generally arranged in a horizontal plane, and can be electrically connected to external terminals. As shown in FIG. 3, the first and second leads 4 and 5 at least on the back surface side can be coated by thin insulating members 21 that are formed an electrically insulating resin. In this case, when the back surfaces of the leads 4 and 5 are mounted on a base member by using solder or the like, the insulating members 21 stop deviation of the solder. Accordingly, it is possible to prevent a short circuit between the first and second leads 4 and 5. In addition to this, it is possible to increase the stability when the back surfaces of the leads 4 and 5 are mounted on.

Material of Lead

The first lead 4 and the second lead 5 can be formed of electrically conductive material such as iron, fluorescent material bronze, and copper alloy. Similar to the case of the aforementioned base 3, in the case where the surfaces of the leads are plated with metal, or are provided with a heat dissipation member, it is possible to increase the reflectivity for light from the light emitting devices 2, or a heat dissipation effect. In order to further increase the reflectivity of the surface of the first and second leads 4 and 5, the areas of the first and second leads 4 and 5 can be large. In this case, since the temperature rise of the light emitting devices 2 can be effectively suppressed, relatively a large amount of current can be applied to the light emitting devices 2. In the case where the first and second leads 4 and 5 are formed thick, the heat dissipation characteristics can be improved. However, in this case, forming is difficult that bends the first and second leads 4 and 5. For this reason, the first and second leads 4 and 5 are preferably cut into a certain size. Also, in the case where the first and second leads 4 and 5 are formed thick, the distortion of the first and second leads 4 and 5 can be reduced. Accordingly, the light emitting devices 2 can be easily installed. On the other hand, in the case where the first and second leads 4 and 5 are formed in a thin plate shape, the first and second leads 4 and 5 can be easily bent.

The connection parts 4d and 5d can have at least a certain area that can provide electrical connection between the connection parts 4d and 5d and the electrodes of the light emitting devices 2. However, the connection parts 4d and 5d preferably have a large area in terms of the reflective efficiency of the connection parts 4d and 5d. Whether the areas of the connection parts 4d and 5d are increases or decreased depends on the amount of opening of the recessed portion 13 that divides areas into the connection parts 4d and 5d, and the embedded parts 4c and 5c, that is, on the position of the side surface 13a. For this reason, the areas of the connection parts 4d and 5d are preferably determined in consideration of the reflectivity of the side surface 13a and the light guiding direction by the side surface 13a.

Heat that is generated from a light source is conducted to the connection parts of the leads that are located near the light source, and is then conducted to the outer lead portions that are externally exposed. As a result, the heat that is generated from the light source can be externally dispersed. In other words, the leads serve to conduct heat.

Heat Dissipation Member

As shown in FIG. 3, the base 3 and/or the leads 4 and 5 can be coupled to the heat dissipation members 20. The heat dissipation members 20 are formed of a material that has at least heat dissipation characteristics. The heat dissipation members 20 are preferably formed of a material that has heat dissipation characteristics and electrical conductive characteristics. Thus, heat that is generated from a light source is thermally conducted to the heat dissipation members 20 via the base 3 that is located near the devices. Accordingly, the heat dissipation members 20 can externally disperse the heat. In addition to this, the heat dissipation members 20 can make full use of the heat dissipation characteristics and the electrical conductive characteristics of the leads 4 and 5 that are conducted to the light emitting devices 2.

The heat dissipation members 20 are preferably coupled to the back surface of the base 3 and/or the leads 4 and 5 as suitable positions. The reason is that, if the heat dissipation member 20 is located on the main surface side, particularly in the recessed portion 13, the heat dissipation member 20 will absorb light, and as a result the heat dissipation member 20 will cause light loss. In the case where the heat dissipation members 20 are coupled to the base 3 and/or the leads 4 and 5 on the back surface side, the materials of the heat dissipation members 20, the base 3, and the leads 4 and 5 are required to be taken into consideration of the coupling positions. Specifically, in the case where an electrically conductive material is used for the heat dissipation members 20, the heat dissipation members 20 are arranged in positions where the first lead 4 and the second lead 5 will not be electrically connected to other members. The heat dissipation member 20 can be formed of not only one material but also two or more types of materials to provide these heat dissipation characteristics and electrical conductive characteristics. For example, an example of indices can be provided by thermal conductivity. The heat dissipation member 20 can be formed of a material with thermal conductivity of about 10 to 500 W/m·K. Examples of such a material can be provided by metal, alloy, metal paste, electrically-conductive paste, combined material of thin metal film and resin, and the like. Specifically, examples of such a material can be provided by metal paste that contains solder, aluminum, copper, silver, chromium, gold and the like alone, or a combination of them. Alternatively, examples of such a material can be provided by a member that is a single layer or multi-layer of solder, aluminum, copper, silver, chromium, gold and the like that is formed on the base 3 or the lead 4 or 5, and is provided with epoxy resin, acrylic resin, silicone resin, urethane resin, polyimide resin, acrylate resin, polycarbonate resin, polynorbornene resin, denatured silicone resin, amorphous polyamide resin, fluorocarbon resin, or the like inside the layer.

Arrangement of Light Emitting Device Group

In the light emitting apparatus 1 according to the first embodiment, a plurality of light emitting devices 2 are mounted in a plurality of rows that are aligned in parallel on the base 3 that is externally exposed in the bottom surface area of the opening of the first resin molding member 11. The rows preferably include the same number of the mounted light emitting devices 2. In this case, in the light emitting apparatus 1 as a whole, since the lengths of light sources in the rows can be generally same, that is, since light sources can be arranged generally symmetrically with respect to the center of the light emitting apparatus, it is possible to reduce color unevenness of light emitted from the light sources. In addition to this, the heat amount can be uniformly distributed, and uneven distribution of heat can be suppressed that is stored in the apparatus. Accordingly, it is possible to provide a highly reliable and high power light emitting apparatus. As the number of the mounted devices increases, even if there is a difference to some degree in the number of the light emitting devices 2 that are mounted in each row, the difference between heat amounts that are generated in the rows is getting smaller, and the unevenness of heat can be suppressed. In this specification, the term "symmetrically" refer to substantially symmetrically, and not limited to symmetrically in a strict sense.

The wavelength of light that is emitted from the mounted light emitting devices is not specifically limited. The mounted light emitting devices can emit the same color group light or different colors of light, for example. For example, in the case where the light emitting devices are mounted that emits blue group light, green group light and red group light that correspond to three primary colors of light, it is possible to provide a light emitting apparatus that can emit light in the whole color range.

In the light emitting apparatus 1 according to FIGS. 1 and 2, a first light emitting device group 2c is arranged in one row on a left-side area that is located on the left side with respect to the center divisional line, and a second light emitting device group 2d is arranged in one row on a right-side area that is located on the right side with respect to the center divisional line, and extends in parallel to the first light emitting device group 2c. Each of the first and second light emitting device groups 2c and 2d includes three light emitting devices that are aligned in each row. The light emitting devices 2 are preferably mounted in direct contact with the upper surface of the base 3. In this case, the heat dissipation characteristics are improved. However, in the case where the base 3 is covered by the first resin molding member 11, the light emitting devices 2 can be mounted on the first resin molding member 11 that covers the upper surface of the base 3.

Electrical Connection

The light emitting device groups 2c and 2d are electrically connected to the sets of the lead pairs 6 that are located closer to the light emitting device groups 2c and 2d. That is, as shown in FIGS. 1 and 2, the sets of the lead pairs 6a and 6b are spaced away and arranged on left and right side with respect to the base 3. Each of the lead pairs 6a and 6b is composed of the first lead 4 and the second lead 5. The first light emitting device group 2c that is mounted on the left side of the base 3 is electrically connected to the lead pair 6a on the left side that is located closer to the first light emitting device group 2c. Similarly, the right-side second light emitting device group 2d is electrically connected to the right-side lead pair 6b.

Specifically, each of the light emitting devices in each of the light emitting device groups 2c and 2d has a first electrode and a second electrode. The same type electrodes of the devices in the same group are connected to each other by an electrically conductive member such as wire line 7. As for the light emitting devices that are located on the both ends in each of the light emitting device groups 2c and 2d, the first electrode of the light emitting device that is located on one end is connected to the connection part 4d of the first lead 4 that corresponds to the first electrode by the electrically conductive member such as wire line 7. Also, the second electrode of the light emitting device that is located on the other end is connected to the connection part 5d of the second lead 5 that corresponds to the second electrode by the electrically conductive member. Also, the externally exposed portions of the lead pair 6 can be electrically connected to external terminals by an electrically conductive member such as solder. Thus, the light emitting devices 2 can be provided with electric power.

Wire Line

The wire lines 7 electrically connect the first and second electrodes of the light emitting devices 2 to the first and second leads 4 and 5. The wire line 7 is preferably formed of a material that has excellent ohmic characteristics for the electrode of the light emitting device 2, mechanical connection characteristics, electrical conduction characteristics, and thermal conduction characteristics. For example, the thermal conductivity of the wire line is preferably not less than 0.01 cal/(s)(cm$^2$)(° C./cm), and more preferably not less than 0.5 cal/(s)(cm$^2$)(° C./cm). The wire line extends from directly above one light emitting device to the electrode of other light emitting device, or the connection part 4d or 5d of the first or second lead so that these members are electrically connected by wire-bonding.

In this specification, the light emitting device 2 mount surface side or connection surface side is referred to as "upper side" or "main surface side". Also, the term "on" used in explanation of arrangement is not limited to the state where a member is formed in contact with a base member but occasionally includes the state where a member is formed above a base member to be spaced away from the base member, in other words, the state where a member is formed to interpose an intermediate member between the member and the base member in an inclusive sense. Also, the side opposite to the "upper side" or "main surface side" is referred to as "lower side" or "back surface side".

Protection Device

The light emitting apparatus 1 according to FIGS. 1 to 4 includes the protection devices 14. The protection device 14 can be a Zener diode 14a that becomes in a conductive state when a specified voltage or more is applied, or a capacitor that absorbs a pulse voltage, and so on. The Zener diode 14a has a p-type semiconductor region with a positive electrode, and an n-type semiconductor region with a negative electrode. The positive and negative electrodes of the Zener diode 14a are electrically connected to the p-side and n-side electrodes of the light emitting elements 10 in parallel but in inverted connection. The negative and positive electrodes that are provided in the Zener diode are connected to external terminals via the lead pair 6. Thus, when an overvoltage is applied between the terminals, even if the voltage exceeds the Zener voltage of the Zener diode, the voltage between the positive and negative electrodes of the light emitting device 2 is held at the Zener voltage. Accordingly, the voltage in the light emitting device 2 does not exceed the Zener voltage. As a result, it is possible to prevent that an overvoltage is applied to the light emitting device 2. Therefore, it is possible to protect the light emitting device 2 from overvoltage. Consequently, it is possible to prevent that the light emitting device 2 suffers damage and that the performance of the light emitting device 2 deteriorates. The size of the Zener diode 14a is not specifically limited as long as the Zener diode 14a can be embedded in the side wall of the recessed portion 13. For example, a protection device with size of 280 μm square can be used. Also, a protection device with size of 300 μm square can be used. The protection device may be partially exposed external of the resin member. However, it is preferable that the protection device is covered by the resin member completely not to be exposed at least on the opening side of the recessed portion 13. In this case, it is suppressed that light emitted from a light source is reflected and absorbed by the protection device. Accordingly, it is possible to improve the light outgoing efficiency of light emitting apparatus.

Second Resin Molding Member

The opening of the recessed portion 13 in the first resin molding member 11 is filled with the second thermosetting resin material 16 so that the second thermosetting resin material 16 comes in contact with at least a part of the first resin molding member 11. Thus, the second resin molding member 12 is formed. In other words, the second thermosetting resin material 16 covers the light emitting devices 2 that are mounted in the bottom surface area of the recessed portion 13. Thus, the light emitting devices 2 are embedded in the second resin molding member 12. That is, the second thermosetting resin material 16 serves to protect the light emitting devices 2 from external force of the environmental influence, dust, moisture, and the like. For this reason, the second resin molding member is preferably formed of a hard and tough material. Accordingly, the second resin molding member 12 is preferably formed of at least one material selected from the group consisting of epoxy resin, denatured epoxy resin, silicone resin, denatured silicone resin, acrylate resin, urethane resin, and polyimide resin among thermosetting resins. In particular, the second resin molding member 12 is preferably formed of epoxy resin, denatured epoxy resin, silicone resin, and denatured silicone resin. In this case, it is possible to provide an apparatus that has excellent heat resistance and light resistance. It is preferable that the thermosetting resin does not contain an aromatic component in the molecule of the thermosetting resin if possible. In this case, it is possible to provide a surface mount type light emitting apparatus that has excellent heat resistance, light resistance, and so on.

Shape

The second resin molding member can be formed in a desired shape on the light emission side to provide a lens effect. In this case, light from the light emitting devices can be focused. Specifically, the second resin molding member can have a convex lens shape, a concave lens shape, an ellipse shape as viewed from the light observation surface side, or a combination shape of two or more types of these shapes.

Additives

In order for the second resin molding member 12 to have various functions, the second resin molding member 12 can be mixed with at least one material selected from the group consisting of filler, diffusion material, pigment, fluorescent material, reflexive material, ultraviolet absorption material, and antioxidant material. In addition to this, various types of additives can be added. Accordingly, light emitted from the light emitting apparatus 1 can be a desired color tone with reduced color unevenness. Examples of diffusion materials can be provided by barium titanate, titanium oxide, aluminum oxide, silicon oxide, silicon dioxide, heavy calcium carbonate, light calcium carbonate, silver, a mixture containing at least one type of them, and the like. In this case, it is possible to provide a light emitting apparatus with excellent directivity. Organic or inorganic coloring dye or coloring pigment can be added as a filter material that provides a filter effect that cuts light with undesired wavelength.

A fluorescent material can be included that absorbs at least a part of light from the light emitting devices 2 and converts the wavelength of the light. In this case, it is possible to provide a light emission color different from the light emission color of light emitted from light emitting device. For example, in the case where the apparatus includes a light emitting device that emits blue light, and a fluorescent material that emits yellow light, it is possible to provide white light. The fluorescent material is uniformly distributed in the second resin molding member 12. In the case where a luminescent layer consists of one layer, the layer can include two or more types of fluorescent materials. Alternatively, in the case where a luminescent layer consists of two layers, each layer can include one type of fluorescent material, or two or more types of fluorescent materials. It is preferable that a fluorescent material is uniformly distributed in each layer. In this case, the wavelength conversion material can perform uniform wavelength conversion irrespective of parts of the wavelength conversion material. Therefore, it is possible to provide uniform mixture light without unevenness. In the case where a fluorescent material is used that has a specific gravity greater than the second resin molding member 12, the fluorescent material can sediment on the bottom surface side in the recessed portion 13, that is, near the light emitting devices 2. In this case, it is possible to provide a light emitting apparatus that can efficiently convert light emitted from a light source, and has stable wavelength conversion amount and less color unevenness. On the other hand, a fluorescent material can be unevenly distributed to be located at low density near the light emitting devices 2 and to be located at high density on the light outgoing side. In this case, since the fluorescent material is spaced away from the light emitting devices 2, heat and high density light energy that are generated by the light emitting devices 2 are less likely to be conducted to the fluorescent material. Therefore, it is possible to suppress deterioration of the fluorescent material.

In addition, a filler can be added in addition to a fluorescent material. Specifically, materials similar to the diffusion materials can be used as a material of the filler. However, the filler has a center particle size different from the diffusion material. In this specification, the filler preferably has a center particle size of not less than 0.1 μm to not more than 100 μm. In the case where the second molding resin member 12 contains this type of filler, chromaticity unevenness of the light emitting apparatus can be improved by light dispersion, and additionally thermal shock resistance of the second molding resin member 12 can be improved. Accordingly, it is possible to provide a highly reliable light emitting apparatus that can prevent disconnection of wire lines that connect the light emitting devices and the leads, detachment of the bottom surfaces of the light emitting devices 2 from the upper surface of the base 3, and so on, even in use under high temperature. Additionally, resin can be adjusted so as to have constant flowability for a long time. As a result, the second molding resin member 12 can be formed in a desired location. Therefore it is possible to mass-produce light emitting apparatuses at high yield.

The second molding resin member 12 preferably has adhesiveness. In this case, it is possible to improve bonding characteristics between the second molding resin member 12 and the light emitting devices 2. In addition to a resin that has adhesiveness at room temperature, a resin can be used that will have adhesiveness when certain heat and pressure are applied to the second molding resin member 12. In order to improve adhesive strength of the second molding resin member 12, in addition to applying of heat or pressure, this type of resin can be dried.

Fluorescent Material

A material can be used as the fluorescent material as long as the material absorbs light from the light emitting devices 2 and emits light with wavelength different from the light from the light emitting devices 2. For example, it is preferable to employ at least one material selected from the group consisting of a nitride group fluorescent material, a nitride oxide group fluorescent material and a SiAlON group fluorescent material that are mainly activated by lanthanoide group elements, such as Eu and Ce; an alkaline-earth halogen apatite fluorescent material, an alkaline-earth-metal boric-acid halogen fluorescent material, an alkaline-earth-metal aluminate fluorescent material, an alkaline-earth silicate fluorescent material, an alkaline-earth sulfide fluorescent material, an alkaline-earth thiogallate fluorescent material, an alkaline-earth silicon nitride fluorescent material and a germanate fluorescent material that are mainly activated with an element of lanthanoids groups such as Eu, and transition-metal groups such as Mn; a rare earth aluminate fluorescent material and a rare earth silicate fluorescent material that are mainly activated by lanthanoide group elements such as Ce; and an organic material and organic complex that are mainly activated by lanthanoide group elements such as Eu.

In the light emitting apparatus, two or more types of fluorescent materials can be mixed. That is, two or more types of fluorescent materials can be mixed that are formed of $(Re_{1-x}Sm_x)_3(Al_{1-y}Ga_y)_5O_{12}$:Ce with different contents of Al, Ga, Y, La, Lu, Gd, and Sm so that the wavelength components of RGB can be increased. In the case where a nitride fluorescent material is used that emits yellow to red light, a reddish component can be increased. In this case, it is possible to provide lighting with high general color rendering index Ra, or an LED with electric bulb color. Specifically, the amount of fluorescent material with a chromaticity point different from a light emitting device on the chromaticity diagram of CIE is adjusted based on the light-emission wavelength of the light emitting device. As a result, it is possible to emit light at any point on the chromaticity diagram on the line that is connected between the fluorescent material and the light emitting device. Specifically, the following fluorescent materials can be used, however, a fluorescent material is not limited to these fluorescent materials.

Examples of nitride group fluorescent materials that are mainly activated by a lanthanoid element, such as Eu and Ce are provided by $M_2Si_5N_8$:Eu, $CaAlSiN_3$:Eu (where M is at least one element selected from the group consisting of Sr, Ca, Ba, Mg and Zn) and the like. In addition to $M_2Si_5N_8$:Eu, $MSi_7N_{10}$:Eu, examples of this type of fluorescent material can be provided by $M_{1.8}Si_5O_{0.2}N_8$:Eu, $M_{0.9}Si_7O_{0.1}N_{10}$:Eu (where M is at least one element selected from the group consisting of Sr, Ca, Ba, Mg and Zn) and the like.

An example of nitride oxide group fluorescent material that is mainly activated by a lanthanoid element, such as Eu and Ce is provided by $MSi_2O_2N_2$:Eu (where M is at least one element selected from the group consisting of Sr, Ca, Ba, Mg and Zn) or the like.

Examples of SiAlON group fluorescent materials that are mainly activated by a lanthanoid element, such as Eu and Ce are provided by $M_{p/2}Si_{12-p-q}Al_{p+q}O_qN_{16-p}$:Ce, M-Al—Si—O—N (where M is at least one element selected from the group consisting of Sr, Ca, Ba, Mg and Zn; q is 0 to 2.5; and p is 1.5 to 3) and the like.

An example of alkaline-earth halogen apatite fluorescent material that is mainly activated by a lanthanoid group element such as Eu or a transition metal group element such as Mn is provides by $M_5(PO_4)_3X$:R (where M is at least one element selected from the group consisting of Sr, Ca, Ba, Mg and Zn; X is at least one element selected from the group consisting of F, Cl, Br and I; and R is at least one selected from the group consisting of Eu, Mn, and combination of Eu and Mn) or the like.

An example of alkaline-earth-metal boric-acid halogen fluorescent material is provided by $M_2B_5O_9X$:R (where M is at least one element selected from the group consisting of Sr, Ca, Ba, Mg and Zn; X is at least one element selected from the group consisting of F, Cl, Br and I; and R is at least one selected from the group consisting of Eu, Mn, and combination of Eu and Mn) or the like.

Examples of an alkaline-earth-metal aluminate fluorescent material are provided by $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (where R is at least one selected from the group consisting of Eu, Mn, and combination of Eu and Mn).

Examples of alkaline-earth sulfide fluorescent material are provided by $La_2O_2S$:Eu, $Y_2O_2S$:Eu, $Gd_2O_2S$:Eu and the like.

Examples of rare earth aluminate fluorescent materials that are mainly activated by a lanthanoid group element such as Ce are provided by YAG group fluorescent materials that are represented by the composition formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$, and the like. In addition to them, examples of such rare earth aluminate fluorescent materials are provided by $Tb_3Al_5O_{12}$:Ce and $Lu_3Al_5O_{12}$:Ce that are obtained by substituting Tb, Lu, or the like, for a part of or the whole of Y, and the like.

Examples of other fluorescent materials are provided by ZnS:Eu, $Zn_2GeO_4$:Mn, $MGa_2S_4$:Eu (where M is at least one element selected from the group consisting of Sr, Ca, Ba, Mg and Zn, and X is at least one element selected from the group consisting of F, Cl, Br and I) and the like.

As for the aforementioned fluorescent materials, at least one element selected the group consisting of Tb, Cu, Ag, Au, Cr, Nd, Dy, Co, Ni and Ti can be contained instead of Eu, or in addition to Eu, if desired.

Also, a fluorescent material other than the aforementioned fluorescent materials can be used that has similar performance and effects A fluorescent material can be used that has a light emission spectrum in a yellow, red, green, or blue range by excitation of light from the light emitting device 2. In addition, fluorescent materials can be also used that have light emission spectra in the intermediate color ranges of yellow, red, green, and blue ranges such as yellow, bluish green and orange. Variety of combinations of these fluorescent materials can provide light emitting apparatus with various light emission colors.

For example, a GaN group compound semiconductor is used that emits blue light, and the blue light is applied to a YAG group fluorescent material of $Y_3Al_5O_{12}$:Ce or $(Y_{0.8}Gd_{0.2})_3Al_5O_{12}$:Ce so that the wavelength of the blue light is converted. In this case, it is possible to provide a light emitting apparatus that mixes light from the light emitting device 2 and light from the fluorescent material to emit white light.

For example, a fluorescent material consisting of $CaSi_2O_2N_2$:Eu or $SrSi_2O_2N_2$:Eu, which emits green to yellow luminescent radiation, $(Sr, Ca)_5(PO_4)_3Cl$:Eu, which emits blue luminescent radiation, and $Ca_2Si_5N_8$:Eu or $CaAlSiN_3$:Eu, which emits red luminescent radiation is used. In this case, it is possible to provide a light emitting apparatus that emits white light and has excellent color rendering. In this case, since red, blue and green of the primary colors are used, variation of the composition ratio of first and second fluorescent materials can provide desired white light.

Light Emitting Device

Any types of semiconductor light emitting devices, which are produced in well-known manners and have well-known structure in the art, can be used as the light emitting devices in the light emitting apparatus according to the embodiment of the present invention. Typically, a semiconductor light emitting device can be formed of semiconductor layers that are laminated on a substrate.

As for the light emitting device, a semiconductor light emitting device can be suitably used that has semiconductor layers that are epitaxially grown on a growth substrate. An example of the growth substrate 11 is provided by a sapphire substrate. However, the growth substrate is not limited to a sapphire substrate. Known materials such as spinel, SiC, GaN, and GaAs can be used. In the case where not an insulating substrate such as sapphire but an electrically conductive substrate such as SiC, GaN, and GaAs is used, a p-electrode and an n-electrode can be opposed to each other.

The light emitting device 10 can include various materials such as BN, SiC, ZnSe, GaN, InGaN, InAlGaN, AlGaN, BAlGaN, and BInAlGaN. Si, Zn, and so on, can be included in these materials as impurity elements and serve as the center of light emission. Among these materials, a nitride semiconductor or the like can be suitably used which can emits light with short wavelength that can efficiently excite a fluorescent material (e.g., $In_xAl_yGa_{1-x-y}N$, where $0 \leq x \leq 1$, $0 \leq y \leq 1$, $x+y \leq 1$ as a nitride semiconductor containing Al and Ga, or a nitride semiconductor containing In and Ga). Optionally, B, P or As can be mixed into this type of nitride semiconductor to form a mixed crystal. MIS junction, PIN junction, homo structure with pn junction, hetero structure, double-hetero structure, or the like, can be suitably used as the structure of semiconductor layer. The light emission wavelength can be selected by the variation of materials and mixed crystal ratios of the semiconductor layer. The semiconductor layer can have a single- or multi-quantum-well structure that is provided with a thin layer(s) for quantum effect. In this case, it is possible to increase output power. The light emitting device 2 can emit light from the ultraviolet range to the visible range. In particular, it is preferable that the light emitting device are used that has a light emission peak wavelength in the proximity of a range of 350 nm to 550 nm and includes light emission layers that can emit light with a light emission wavelength capable of efficiently exciting a fluorescent material. In this embodiment, a nitride semiconductor light emitting device is described as the light emitting device. However, the light emitting device is not limited to this.

In the case where a nitride semiconductor is used, examples of materials of a substrate that is used to form a light emitting device are provided by sapphire, spinel, SiC, Si, ZnO, GaAs, and GaN. In order to form a nitride semiconductor with excellent crystallinity in quantity, a sapphire substrate is preferably used. Also, a buffer layer that is formed of GaN, AlN, GaAlN or the like may be formed on the sapphire substrate. A nitride semiconductor can be formed on the sapphire substrate by using MOCVD or the like.

The number of the aforementioned light emitting devices is not specifically limited that are mounted in the light emitting apparatus. In the case where a plurality of light emitting devices are mounted, the combination of the devices is not specifically limited that have various types of color tones. For example, in the case where the light emitting apparatus 1 is provided with two light emitting devices that can emit green range light, one light emitting device that can emit blue range light, and one light emitting device that can emit red range light, the light emitting apparatus 1 mixes these colors, and can emit white light. In the case where a plurality of light emitting devices are mounted to provide a full-color light emitting apparatus for a display, light emitting devices are preferably used that have red, green, and blue range light-emission wavelengths that fall within a range of 610 to 700 nm, a range of 495 to 565 nm, and a range of 430 to 490 nm, respectively. In the light emitting apparatus according to the embodiment of the present invention, in the case where the light emitting apparatus emits white range light by mixing light colors, in terms of complementary color relationship between light emission wavelengths of the light emitting device and a fluorescent material that is included in the apparatus together with the light emitting device, deterioration of a transparent resin, and so on, the light emission wavelength of the light emitting device preferably falls within a range of not less than 400 nm and not more than 530 nm, and more preferably a range of not less than 420 nm and not more than 490 nm. In order to further improve excitation and light emission efficiency between the light emitting device and the fluorescent material, the light emission wavelength of the light emitting device most preferably falls within a range of not less than 450 nm and not more than 475 nm. Note that, in the case where the light emitting device is used together with a member that has ultraviolet ray resistance, the light emitting device may have a main light-emission wavelength that falls within a range of less than 400 nm in the ultraviolet range or a short wavelength range in visible light. Examples of the sizes of light emitting devices are provided by 320 μm square, 600 μm square, 1 mm square, and the like.

Production Method of Light Emitting Apparatus

Figure 5:
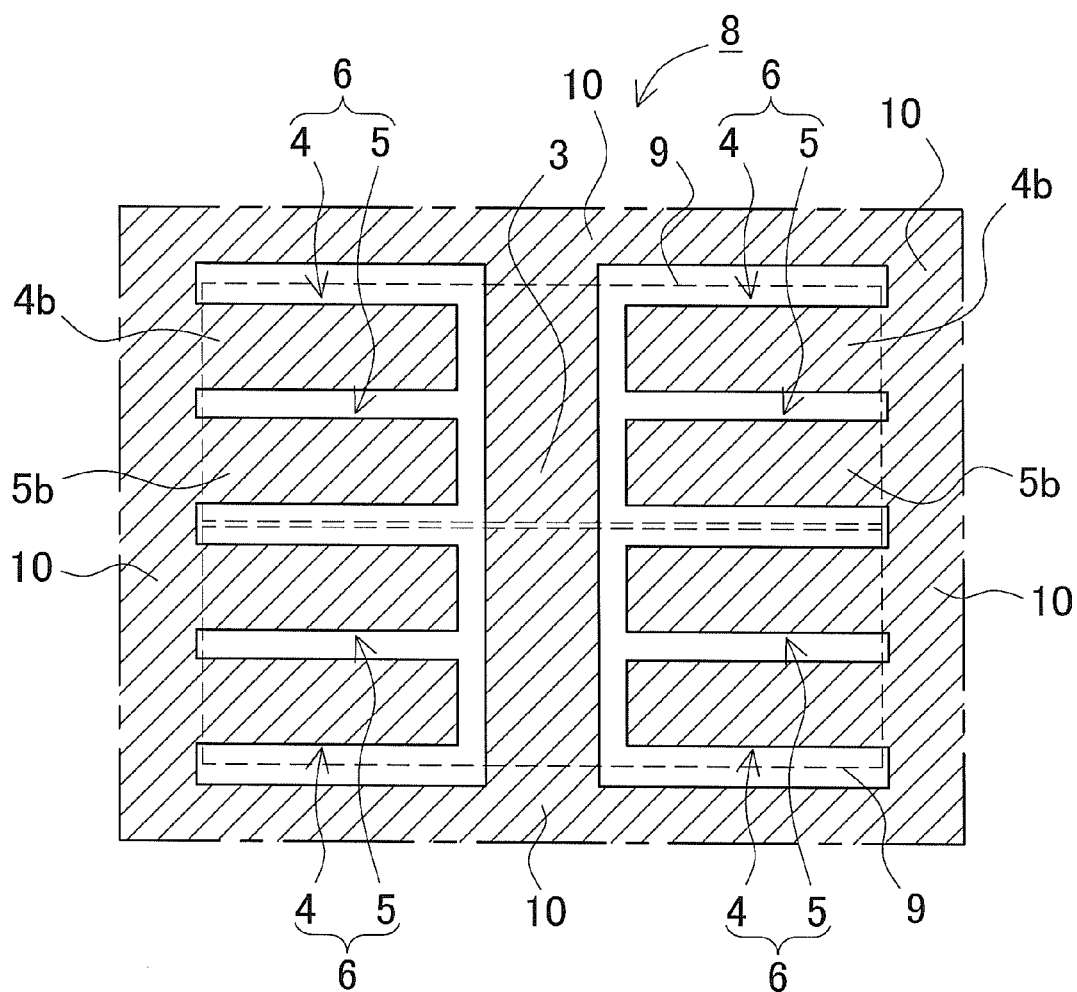
FIG. 5 is a plan view schematically explaining a light emitting apparatus production method according to the first embodiment.

With reference to FIGS. 5 to 13, an exemplary production method of the light emitting apparatus 1 is now described. Two sets of the lead pairs 6 are arranged that will be electrically separated from the base 3 after production of the light emitting apparatus 1 (see FIG. 1) as discussed above. The two sets of the lead pairs 6 are spaced away from the base 3 and are arranged in side areas with respect to the base 3 as the center of the light emitting apparatus 1. In order to thus arrange the base 3 and the lead pairs 6, as shown in FIG. 5, a lead plate 8 that is formed of an electrically conductive material is subjected to die-cutting or the like to provide a pattern of suitable arrangement of the base 3 and the lead pairs 6. An area shown by the dashed line in FIG. 5 corresponds to a pattern 9 of the base 3 and the lead pairs 6 in one light emitting apparatus 1. A plurality of the patterns 9 are arranged in a matrix shape in the lead plate 8. The base 3 and the lead pairs 6 are connected in branched shapes to a lead connection portion 10 that extends from the outer lead portions 4b and 5b and the bases 3. That is, the lead plate 8 is subjected to the following processes to produce a plurality of the light emitting apparatuses 1 at one process cycle. Finally, the lead connection portion 10 is cut off so that the lead plate 8 is divided into the light emitting apparatuses 1. FIGS. 6 to 16 are cross-sectional views schematically showing one light emitting apparatus 1. With reference to FIGS. 6 to 16, the processes are described.

Figure 6:
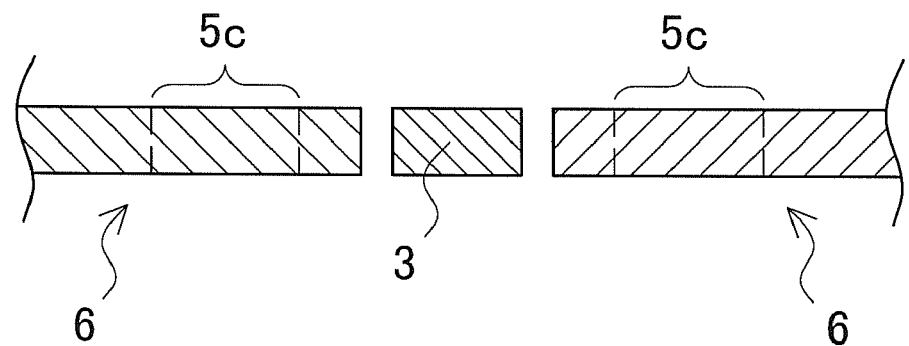
FIG. 6 is a cross-sectional view schematically explaining the light emitting apparatus production method according to the first embodiment.
Figure 7:
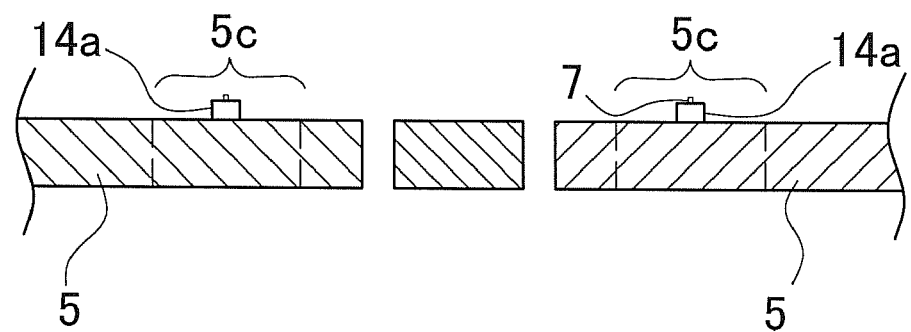
FIG. 7 is a cross-sectional view schematically explaining the light emitting apparatus production method according to the first embodiment.
Figure 8:
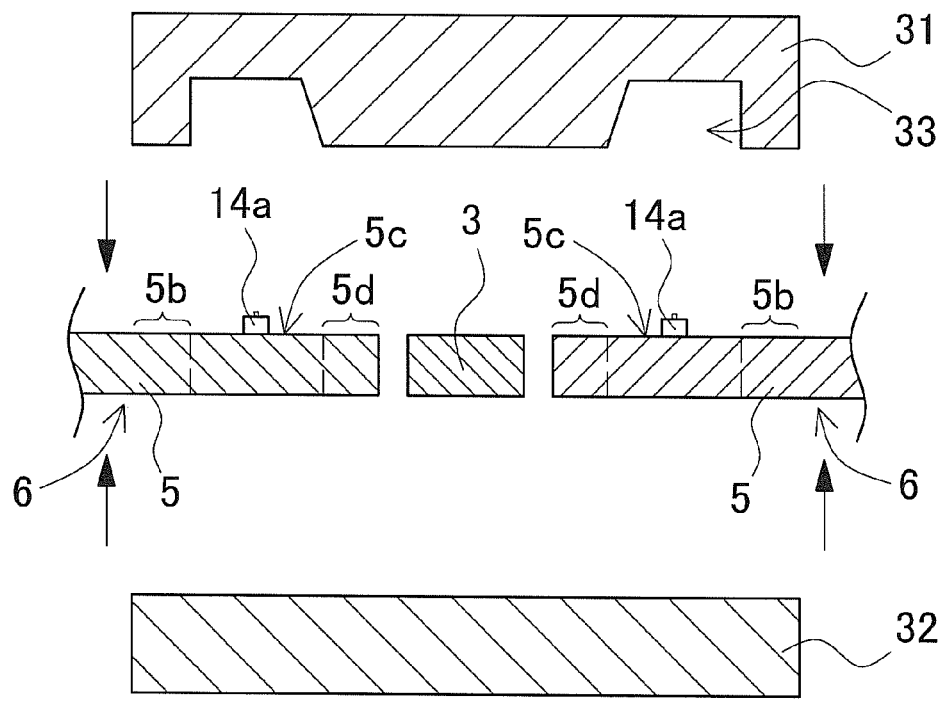
FIG. 8 is a cross-sectional view schematically explaining the light emitting apparatus production method according to the first embodiment.

As shown in FIG. 6, the first lead 4 and the second lead 5 as the lead pair 6 are arranged in the side areas with respect to the base 3 as the center of the light emitting apparatus, and are spaced away from the base 3. The embedded parts 4c and 5c are located generally in the central areas of the first and second leads 4 and 5. As shown in FIG. 7, the protection devices 14 are mounted on the embedded parts 4c or 5c of the first or second lead 4 or 5. In the first embodiment, the Zener diodes 14a as the protection devices 14 are mounted on the embedded parts 5c of the second leads 5. The Zener diode 14a is electrically connected by an electrically conductive member such as the wire line 7 by wire-bonding to the embedded part 4c of the lead that has the different polarity from the lead on which the Zener diode 14a is mounted. Subsequently, the upper and lower surfaces of the lead pairs 6 will be sandwiched by an upper die 31 and a lower die 32 shown in FIG.

Figure 9:
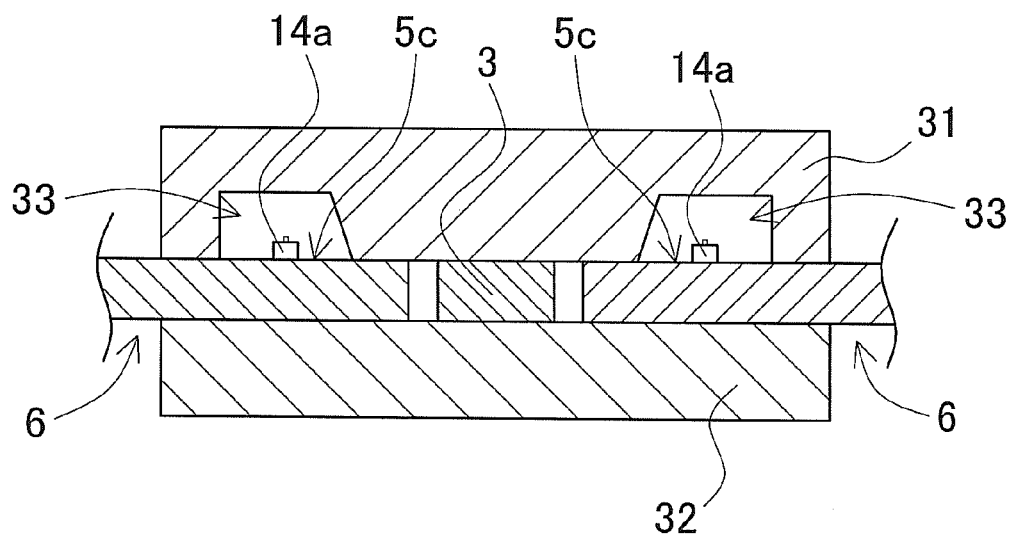
FIG. 9 is a cross-sectional view schematically explaining the light emitting apparatus production method according to the first embodiment.

8. FIG. 9 shows the state where the upper and lower dies 31 and 32 come in contact with the base 3 and the lead pairs 6.

Specifically, the upper die 31 is formed to have protruding and recessed parts that correspond to the shape of the recessed portion 13 of the light emitting apparatus 1 (see FIG. 1). In addition to this, the upper die 31 is formed to come in contact, at least in the lead pairs 6, with the upper surfaces of the connection parts 4d and 5d that are located generally in end areas, and the supper surfaces of the first and second outer lead portions 4b and 5b. The lower die 32 can be opposed to the upper die 31. The lower die 32 is formed to come in contact with at least parts of the lower surfaces of the first and second leads 4 and 5. The contact areas of the lower die 32 includes at least parts of the lower surface of the lead pairs 6, and a part of the lower surface of the base 3.

The embedded parts 4c and 5c are located in a recessed part 33 of the upper die 31 that forms the side wall of the recessed portion 13. The embedded parts 4c and 5c accommodate the Zener diodes 14a and the electrically conductive members that are connected to the Zener diodes 14a. Thus, the recessed part 33 of the upper die 31 does not come in contact with the lead pairs 6. The upper and lower surfaces of the lead pairs 6 are thus sandwiched by the upper die 31 and the lower die 32 shown in FIG. 9 (first process). In the first process, the Zener diodes 14a are arranged in the recessed part 33 of the dies 31 and 32.

Figure 10:
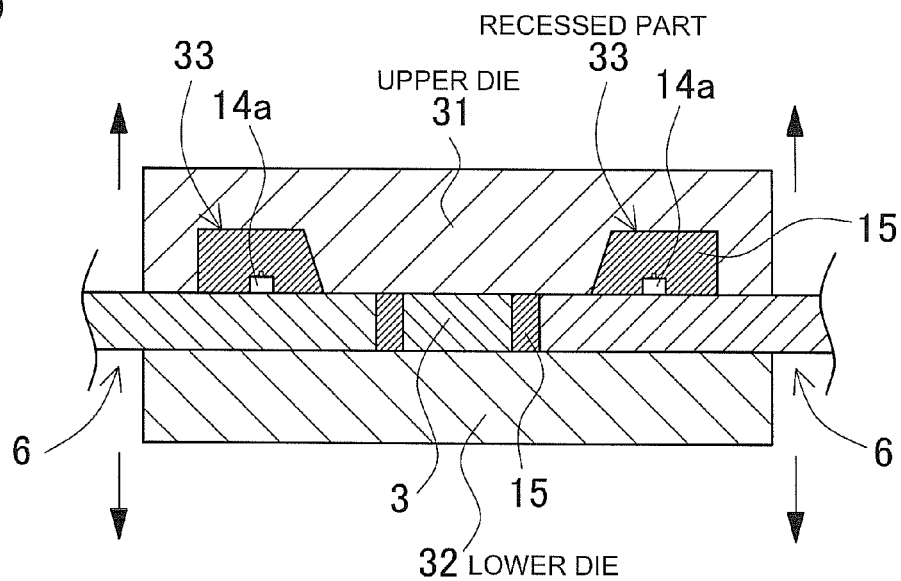
FIG. 10 is a cross-sectional view schematically explaining the light emitting apparatus production method according to the first embodiment.
Figure 11:
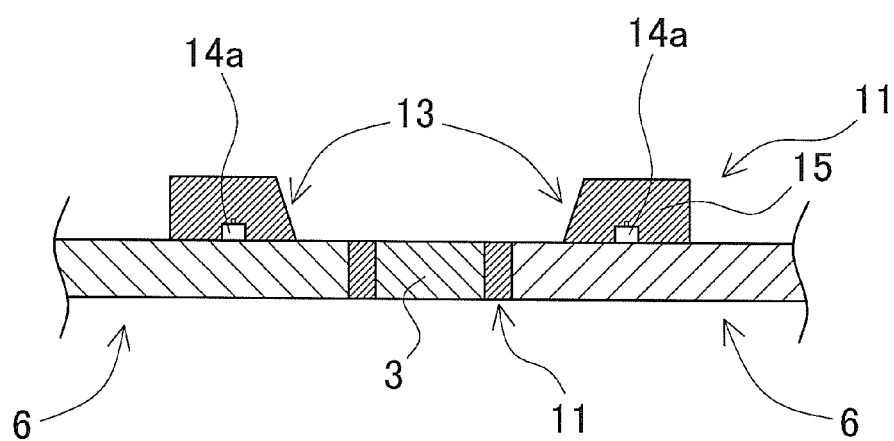
FIG. 11 is a cross-sectional view schematically explaining the light emitting apparatus production method according to the first embodiment.

The first thermosetting resin material 15 flows into the recessed part 33 by transfer molding (second process). The transfer molding is a thermosetting resin formation process that, after softening a thermosetting material such as non-flame-retarded resin in a heating pot, fills a cavity of heated die with the thermosetting material and then cures the thermosetting material. Specifically, the first thermosetting resin material with a pellet shape and a certain size is inserted into the heating pot (not shown). The first thermosetting molding resin material is melted under condition of die temperature in a range of 100 to 220° C., and pressure of 1 to 50 MPa is applied to the first thermosetting resin material. Thus, as shown in FIG. 10, the first thermosetting resin material 15 flows into the recessed part 33 that are defined by the upper and lower dies 31 and 32 that are connected to the pot to cover the Zener diodes 14a. In the state where the Zener diodes 14a are embedded in the resin material, pressure is applied to the first thermosetting resin material 15 for a period of 5 to 600 seconds to cure the first thermosetting resin material 15 (third process). After the dies are moved, as shown in FIG. 11, the base 3 and the lead pairs 6 are formed integrally with each other. The first resin molding member 11 is detached from the dies (fourth process). The first resin molding member 11 is thus provided with the recessed portion 13 that has the side surface. In the case where the first resin molding member 11 is further hardened, the first resin molding member 11 is subjected to post-curing treatment. In this case, the mechanical strength of the resin molding member 11 can be improved. The Zener diodes 14a are embedded in the wall surface of the recessed portion 13. The first resin molding member 11 is formed of a thermosetting resin. Accordingly, it is possible to provide a package that has excellent heat resistance, light resistance, and bonding characteristics.

Figure 12:
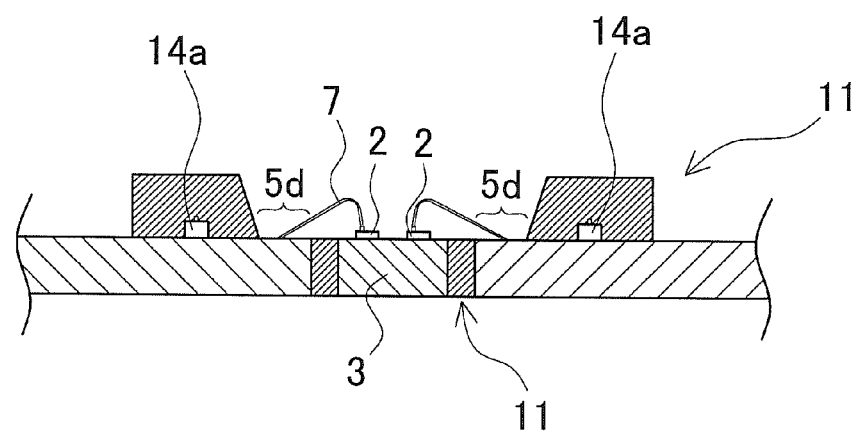
FIG. 12 is a cross-sectional view schematically explaining the light emitting apparatus production method according to the first embodiment.

As shown in FIG. 12, a plurality of the light emitting devices 2 are mounted on the base 3. The first and second electrodes that are included in the light emitting devices 2 are electrically connected to the connection parts 4d and 5d of the first and second leads 4 and 5 (see FIG. 1) by the electrically conductive members such as wire lines 7 (fifth process).

Figure 13:
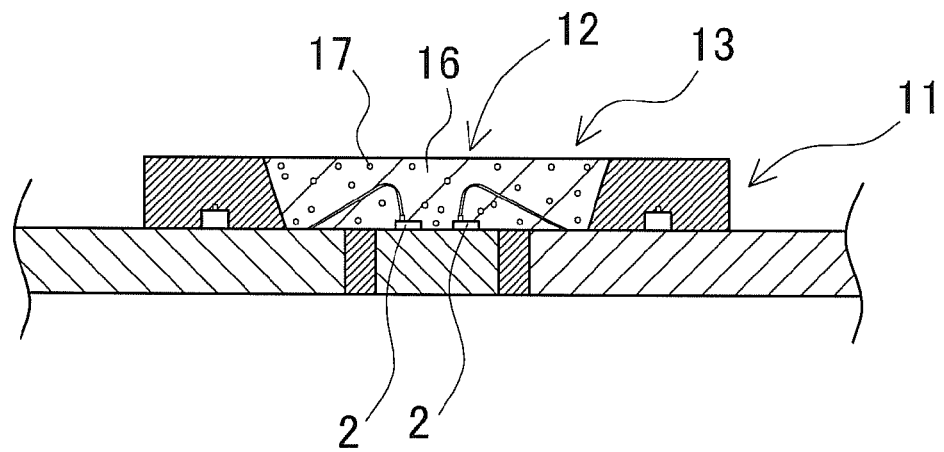
FIG. 13 is a cross-sectional view schematically explaining the light emitting apparatus production method according to the first embodiment.

As shown in FIG. 13, after the light emitting devices 2 are mounted in the recessed portion 13, the opening of the recessed portion 13 is filled with the second thermosetting resin material 16. Thus, the light emitting devices 2 are covered by the resin material (sixth process). The recessed portion 13 is filled with the second thermosetting resin material 16 by dropping means, injection means, extrusion means, transfer molding, and the like. Among them, dropping means is preferable. The reason is that air can be efficiently removed that remains in the recessed portion 13 in this case. The second resin molding member 16 contains at least one material selected from the group consisting of filler, diffusion material, pigment, fluorescent material, reflexive material, ultraviolet absorption material, and antioxidant material. In this case, light emitted from the light emitting apparatus can be a desired color tone with reduced color unevenness. The second thermosetting resin material 16 is heated and cured to form the second resin molding member 12 (seventh process). Since the first resin molding member 11 and the second resin molding member 12 are formed of a thermosetting resin, it is possible to provide a light emitting apparatus that has excellent heat resistance and light resistance. As a result, it is possible to prevent deterioration of the resin molding members 11 and 12 caused by light emitted from the light emitting devices. In addition to this, since the bonding characteristics of resin molding members are improved, peeling of the resin molding members is reduced in the boundary between the resin molding members. Therefore, it is possible to improve the reliability of the apparatus. In the case where the leads are bent to provide bent parts, or in the case where an unevenness part is formed on the side surface of the recessed portion 13, the bonding area is increased between the first resin molding member 11 and the second resin molding member 12. In this case, the bonding characteristics of resin molding members can be further improved. The leads can be bent in an appropriate process before or after the lead connection portion is cut off.

Recessed parts that are formed by the upper and lower dies 31 and 32, and the lead pairs 6 correspond to the exterior shape of the molding member of resin. The resin material does not flow to contact areas between the dies 31 and 32, and the lead pairs 6. Thus, after the resin molding member is formed, the contact areas will be the exposed areas of the leads. For this reason, the upper and lower dies 31 and 32 are formed in a desired shape so that the first resin molding member 11 can be formed that has a shape corresponding to the shape. Accordingly, it is possible to suitably design the exposed areas and the embedded-in-resin areas of the lead pairs 6 and the base 3. For example, the upper die 31 shown in FIG. 9 has the contact areas with the base 3. Accordingly, after the resin molding member is formed, the contact areas will be externally exposed. The upper surface of the lower die 32 has a horizontal plane generally in parallel to the lower surface of the lead pair 6. The upper surface of the lower die 32 comes into contact with the bottom surfaces of the lead pairs 6 and the base 3 so that, after the resin molding member is formed, the contact areas will be externally exposed similar to the case of the upper die 31.

Figure 14:
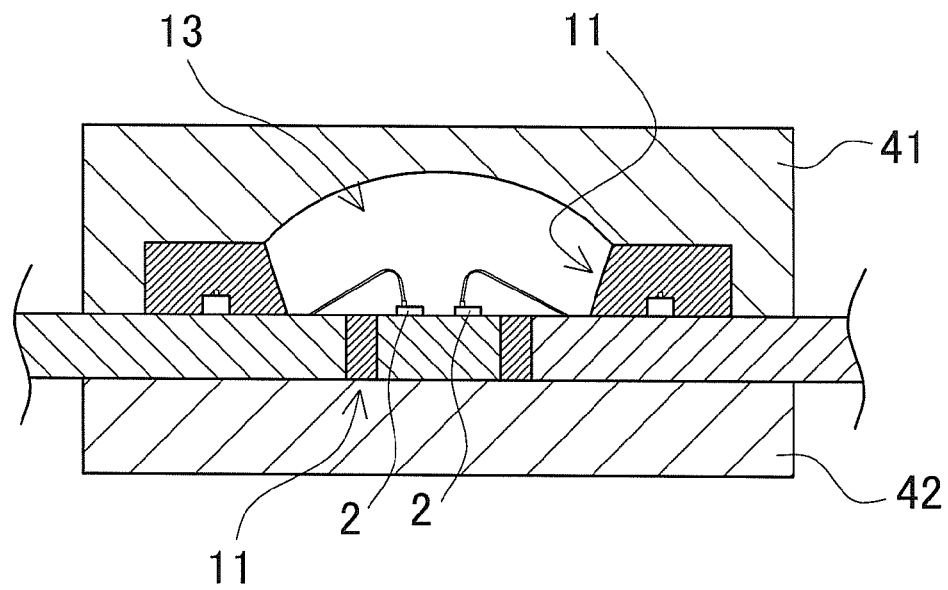
FIG. 14 is a cross-sectional view schematically explaining another light emitting apparatus production method according to the first embodiment.
Figure 15:
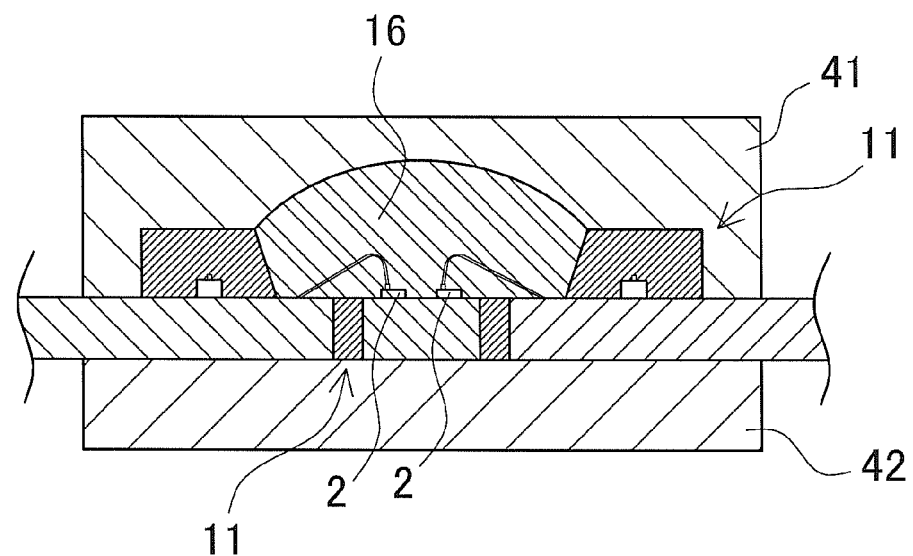
FIG. 15 is a cross-sectional view schematically explaining another light emitting apparatus production method according to the first embodiment.
Figure 16:
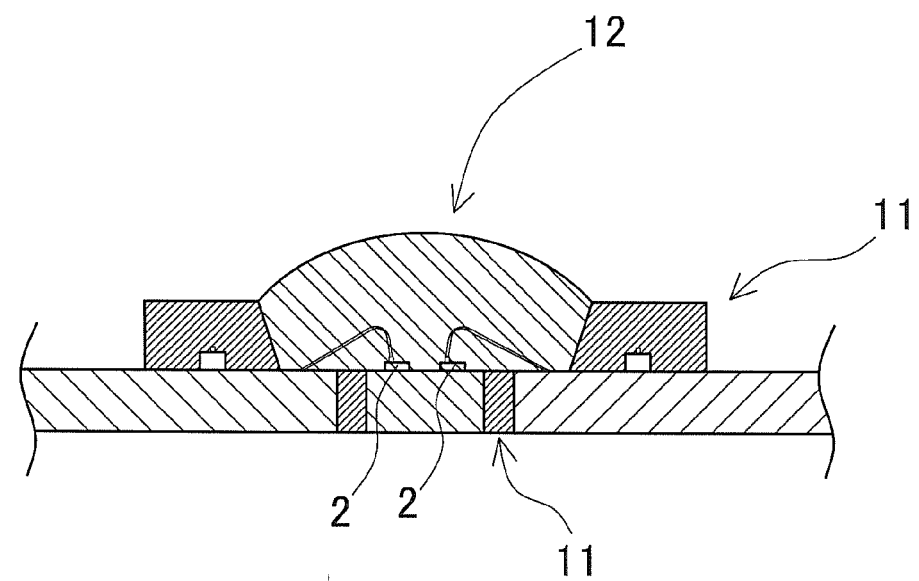
FIG. 16 is a cross-sectional view schematically explaining another light emitting apparatus production method according to the first embodiment.

A production method is described in that a seventh process forms the second resin molding member 12 by transfer molding with reference to FIGS. 14 to 16. FIG. 14 is a cross-sectional view schematically showing the state where the upper die 41 and the lower die 42 sandwich the first resin molding member 11 that is formed, and is provided with the light emitting devices 2 in the aforementioned first to sixth processes as shown in FIGS. 5 to 12. Specifically, the upper die 41 has a shape corresponding to a desired light emission surface shape (e.g., hemispherical shape) of the second resin molding member 12 that is formed in the recessed portion 13, while the lower die 42 has a shape corresponding to the shape of the first resin molding member 11 on the back surface side. Subsequently, as shown in FIG. 15, the second thermosetting resin material 16 flows into the cavity between the dies by the transfer molding. After the second thermosetting resin material 16 is heated and cured to form the second resin molding member, the upper die 41 and the lower die 42 are removed. Thus, as shown in FIG. 16, the second resin molding member 12 can be formed to have various types of shapes. Additives can be mixed in the second thermosetting resin material 16 similarly to the foregoing case. For the sake of brevity, description of additives is omitted. Description of bending and cutting-off for lead is also omitted.

Figure 17:
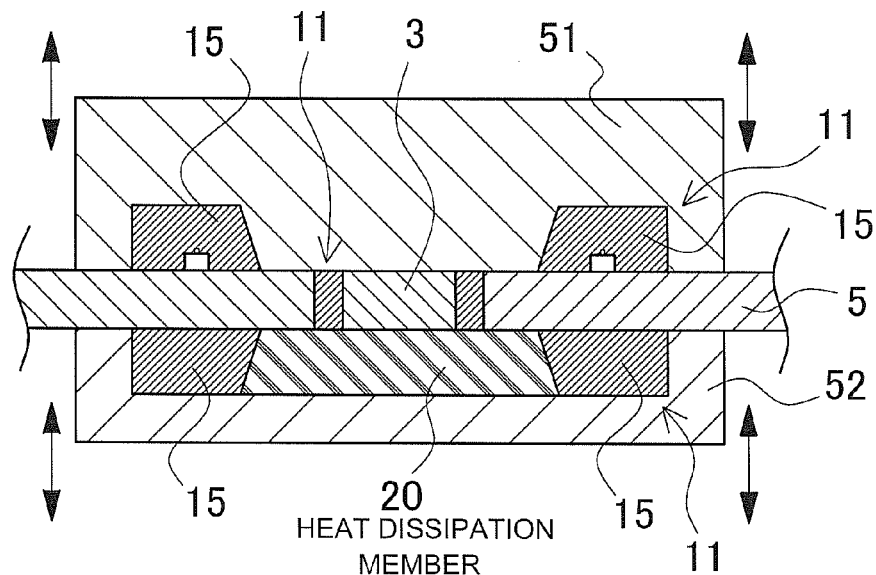
FIG. 17 is a cross-sectional view schematically explaining another light emitting apparatus production method according to the first embodiment.
Figure 18:
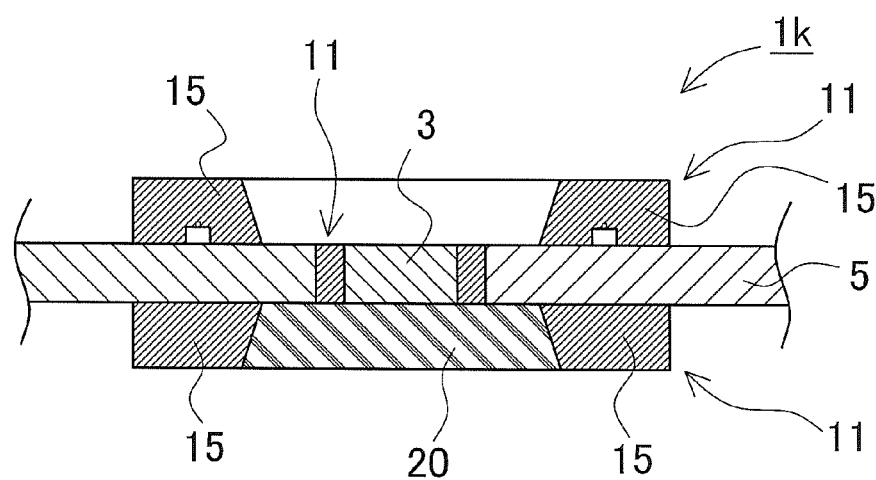
FIG. 18 is a cross-sectional view schematically showing another light emitting apparatus according to the first embodiment.

A production method is described in that the heat dissipation member 20 is formed integrally with the light emitting apparatus with reference to FIG. 17. FIG. 17 shows the state where, after the foregoing first process is conducted, the heat dissipation member 20 is in contact with at least parts of the back surfaces of the base 3 and the leads 4 and 5. An upper die 51 that forms the first resin molding member 11 is formed in a similar shape to the upper die 31 shown in FIG. 8. As shown in FIG. 17, a lower die 52 is formed in a shape that allows the first thermosetting resin member 15 to cover the external surface of the heat dissipation member 20. The cavity between the dies is filled with the first thermosetting resin material 15 by transfer molding. Thus, the heat dissipation member 20 is combined with and formed integrally with in the first resin molding member 11. A light emitting apparatus 1k is shown in FIG. 18 as an exemplary light emitting apparatus with a heat dissipation member. In the case where the heat dissipation member 20 is integrally formed in the resin member, as compared the case where, after the first resin molding member 11 is formed, the heat dissipation member 20 is mounted as a separated member, it is not necessary to take bonding characteristics between the heat dissipation member 20 and the first resin molding member 11 into consideration. In addition to this, the stability of the mount state of the apparatus is increased. The heat dissipation member 20 and the first resin molding member 11 can be arranged generally in the horizontal plane on the back surface side. In this case, the stability of the mount state of the apparatus is further increased. The material of the heat dissipation member 20 is not specifically limited as long as the material of the heat dissipation member 20 has better thermal conductivity than the first resin molding member 11. In the case where the heat dissipation member 20 is formed of an electrically insulating material, the heat dissipation member 20 can have an area that extends over the base 3, the first lead 4, and the second lead 5. Accordingly, it is possible to improve a heat dissipation effect.

In the aforementioned production method, since the upper die 31 and the lower die 32 tightly sandwich the lead pairs 6 to eliminate gaps between the dies and the leads, the first thermosetting resin material does not enter areas between the dies and the leads. Accordingly, it is possible to suppress that a burr appears in the resin molding member 11. Therefore, it is possible to provide a highly reliable light emitting apparatus 1k that reduces a short circuit and the like. It is preferable that only a connection area connected to the electrode is exposed, and other areas are plated with a noble metal such as silver, gold, palladium, and rhodium. In this case, it is possible to prevent corrosion of metal. Note that areas other than the connection area may be exposed to improve light reflectivity.

A light emitting apparatus according to the embodiment of the present invention can be thus configured.

Installation State of Light Emitting Apparatus

Figure 19:
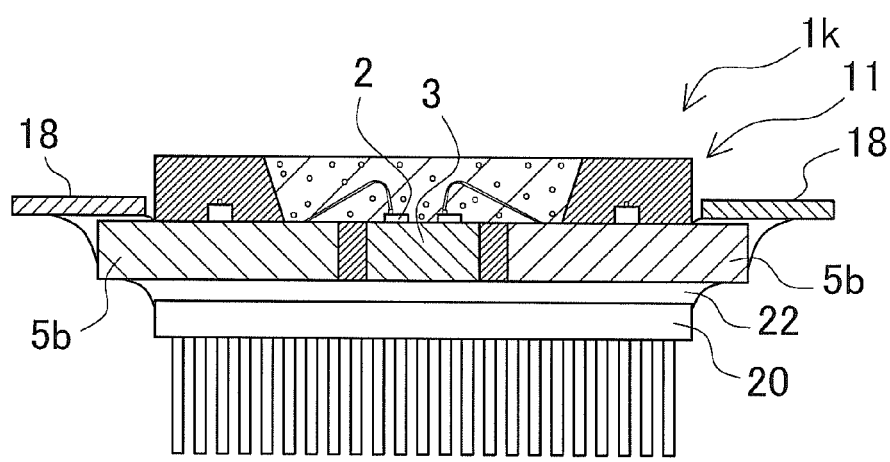
FIG. 19 is a cross-sectional view schematically showing a mount state of the light emitting apparatus according to the first embodiment.

FIG. 19 shows an installation state where the aforementioned light emitting apparatus 1k is electrically connected to external terminals. The first outer lead portion 4b of the first lead 4 and the second outer lead portion 5b of the second lead 5 are electrically connected to the external terminals 18 to provide electric power to the light emitting devices 2. This connection is not specifically is not limited. For example, as shown in FIG. 19, in the case where the first and second leads 4 and 5 are formed in a thick plate, when the light emitting apparatus 1 is interposed between the external terminals 18 and the heat dissipation member 20 and is electrically connected to the external terminals 18, the light emitting apparatus 1 can be brought in a stable installation state. Alternatively, the first outer lead portions 4b can be mounted on the external terminal 18 so that the bottom surfaces of the leads 5b are electrically connected to the external terminal 18. Pb-free solder is preferably used to provide electrical connection.

As shown in FIG. 19, the heat dissipation member 20 can be attached to the back surface of the light emitting apparatus 1 by a heat dissipating adhesion member 22. The heat dissipating adhesion member 22 is preferably formed of a material that has thermal conductivity higher than the material of the first resin molding member 11. Specifically, an electrically insulating epoxy resin, silicone resin or the like can be used. Aluminum, copper, tungsten, gold or the like can be used as the material of the heat dissipation member 20. Aluminum, copper, tungsten and gold have excellent electrical conductivity. In this case, the heat dissipation member 20 can also serve as a power supply path from the external terminal to the light emitting devices 2. In this case, the attachment arrangement of the heat dissipation member 20 is preferably determined in terms of a short circuit that occurs caused by electrical connection between the electrically conductive heat dissipation member 20 and other electrically conductive members. The heat dissipation member 20 may be attached to be in contact only with the base 3 by the heat dissipating adhesion member 22. In this case, as the heat dissipating adhesion member 22, a eutectic metal can be used that contains solder with more excellent electrical conductivity. In addition to this, the heat dissipating adhesion member 22 can be arranged closest to the base 3 on which the light emitting devices 2 that can be heat sources are mounted to intensively disperse heat. Accordingly, it is possible to provide a more effect in heat dissipation.

Second Embodiment

Figure 20:
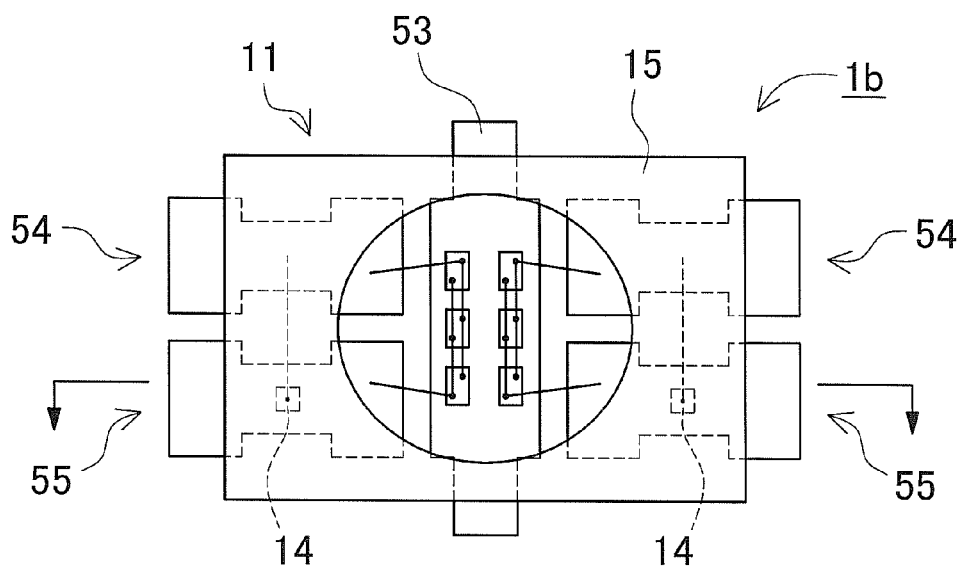
FIG. 20 is a plan view schematically showing a light emitting apparatus according to a second embodiment.

FIG. 20 is a plan view schematically showing a light emitting apparatus 1b according to a second embodiment. Members that are configured similarly to the members of the light emitting apparatus 1 according to the first embodiment are attached with the same reference numerals as the corresponding members of the light emitting apparatus 1, and their description is omitted for the sake of brevity. The shapes of first and second leads, and a base in the light emitting apparatus 1b according to the second embodiment are different from the light emitting apparatus 1 according to the first embodiment. Specifically, the first lead 54 and the second lead 55 of the light emitting apparatus 1b shown in FIG. 20 has a width that is partially reduced in a direction perpendicular to an extending direction of the leads 54 and 55 (vertical direction in FIG. 20) in a plan view from the main surface side. That is, the first lead 54 and the second lead 55 have protruding parts and recessed parts. The base 53 also has a width that is not constant. Accordingly, the contact areas between the first thermosetting resin member 15, and the base 53 and the first and second leads 54 and 55 are increased. Therefore, the bonding characteristics are improved. As a result, peeling of members is reduced. Consequently, the first resin molding member 11 as the first resin molding device can be tough. The protruding and recessed parts that are formed to increase the surface area of lead are not specifically limited in the formation positions, the formation directions, and the shapes. For example, the leads 54 and 55 can be bent in the thickness direction of the light emitting apparatus 1b to form a stepped shape.

Figure 21:
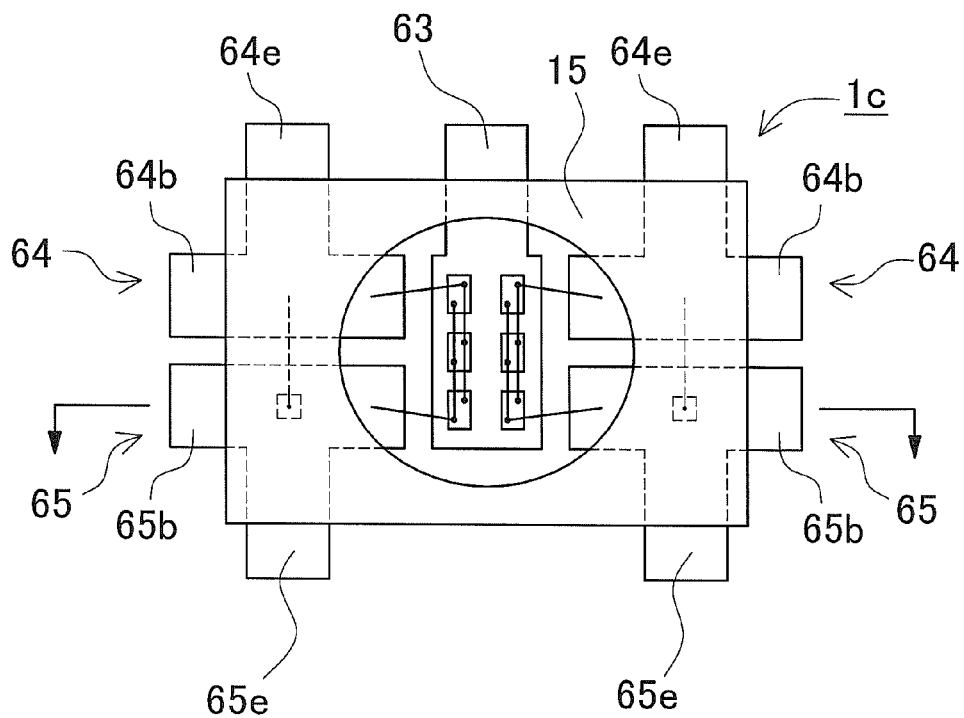
FIG. 21 is a plan view schematically showing another light emitting apparatus according to the second embodiment.

A light emitting apparatus 1c shown in FIG. 21 has first and second leads 64 and 65. The shapes of the first and second leads 64 and 65 are different from the first and second leads in the light emitting apparatus 1b shown in FIG. 20. Specifically, the first lead 64 and the second lead 65 shown in FIG. 21 have a generally T-shape. That is, the shape branches from its central part into three parts. End areas of parts are externally exposed. For example, the illustrated first lead 64 has outer lead portions 64b and 64e that are externally exposed from two adjacent sides that compose a generally rectangular shape of the light emitting apparatus 1c. The second lead 65 also has outer lead portions 65b and 65e that extend outward in two directions from the corner of the apparatus. Only one end of the base 63 is externally exposed. However, the base 63 is not limited to this arrangement. The both ends of the base 63 may be externally exposed similarly to the base shown in FIG. 20. That is, the leads and the base can be designed in various shapes so that the externally exposed areas, and exposure directions of the leads and the base are determined at a high degree of flexibility. Accordingly, in addition to improvement of bonding characteristics between the leads and the base, and the first thermosetting resin member 15, the heat dissipation effect is remarkably improved by the increase of exposed area. Since the leads extend from all the four sides that compose the rectangular shape of the light emitting apparatus 1c, the light emitting apparatus 1c can be stable when installed. In addition to this, since the light emitting apparatus 1c can be installed in any orientation when installed to a separate base member, it is possible to provide a high degree of flexibility in installation.

Third Embodiment

Figure 22:
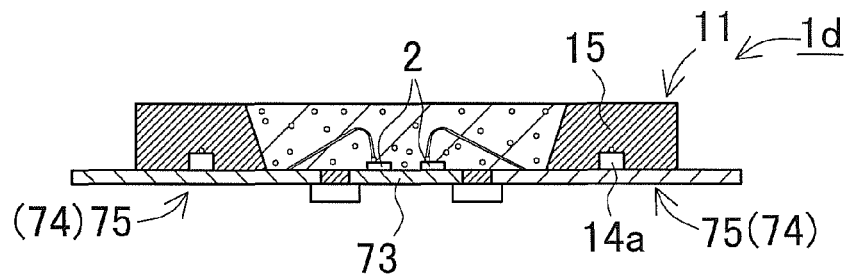
FIG. 22 is a cross-sectional view schematically showing a light emitting apparatus according to a third embodiment.

FIG. 22 is a cross-sectional view schematically showing a light emitting apparatus 1d according to a third embodiment. Members that are configured similarly to the members of the light emitting apparatus 1 according to the first embodiment are attached with the same reference numerals as the corresponding members of the light emitting apparatus 1, and their description is omitted for the sake of brevity. A base 73, and first and second leads 74 and 75 of the light emitting apparatus 1d are thin in the thickness direction. Accordingly, the first resin molding member 11 is also formed in a plate shape. For this reason, the light emitting apparatus 1d can be small or thin. In the transfer molding in that the first thermosetting resin material 15 flows into the cavity between the upper die and the lower die, the first lead 74 and the second lead 75 are sandwiched between the upper die and the lower die. For this reason, even in the case where the leads 74 and 75 are thin, the leads 74 and 75 can be tightly sandwiched. Accordingly, it is suppressed that the resin material enters a undesired part of the lead. Therefore, a burr does not appear in the resin molding member 11.

The thin first and second leads 74 and 75 can be easily bent. For example, in the light emitting apparatus 1e shown in FIG. 23, first and second outer lead portions 74b and 75b of the first and second leads 74 and 75 are externally exposed. The first and second outer lead portions 74b and 75b are bent toward the main surface side generally at a right angle to extend along the external side surfaces of the light emitting apparatus 1e. Accordingly, when the light emitting apparatus 1e is installed to a separate base member, solder comes in contact with the first and second outer lead portions 74b and 75b of the leads, and is elevated. Therefore, the light emitting apparatus 1e and the base member can be firmly fixed.

Figure 23:
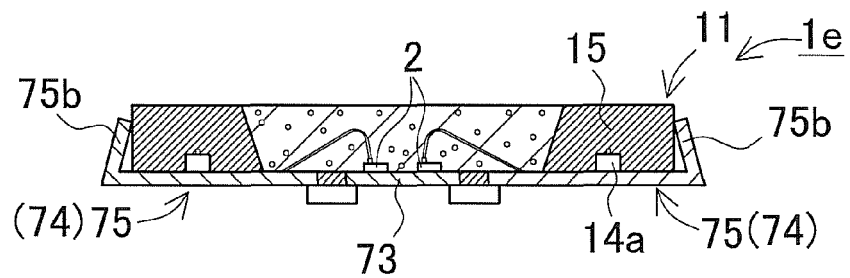
FIG. 23 is a cross-sectional view schematically showing another light emitting apparatus according to the third embodiment.
Figure 24:
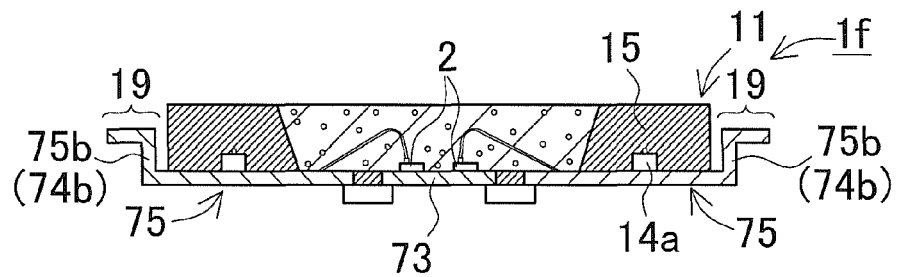
FIG. 24 is a cross-sectional view schematically showing still another light emitting apparatus according to the third embodiment.
Figure 25:
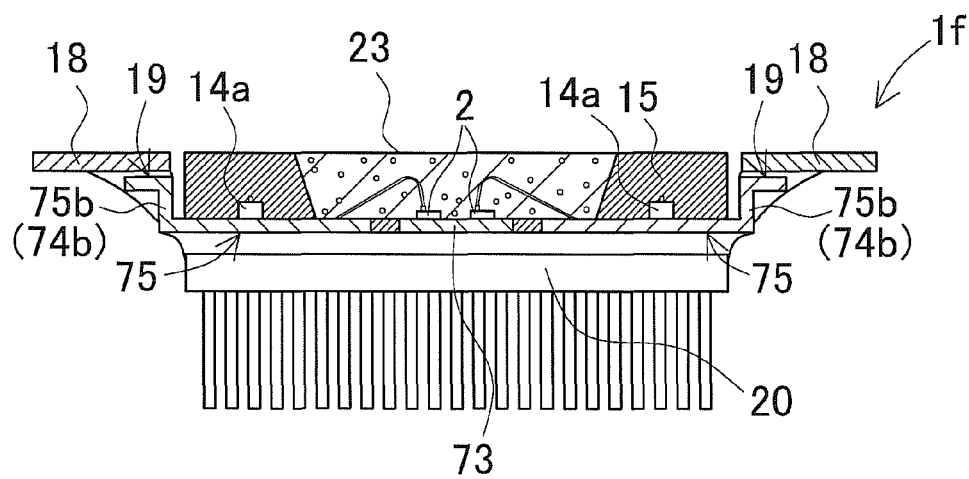
FIG. 25 is a cross-sectional view schematically showing a mount state of the still another light emitting apparatus according to the third embodiment.

In a light emitting apparatus if shown in FIG. 24, end areas of the outer lead portions 74b and 75b of the first and second leads in the light emitting apparatus 1e shown in FIG. 23 are additionally bent outward of the light emitting apparatus. Accordingly, since the light emitting apparatus 1f is interposed between the heat dissipation member 20 and the external terminals 18, the light emitting apparatus 1f can be easily installed, and the stability of the light emitting apparatus 1f can be improved. An area from the bending start point to the end is referred to as a bent part 19 for the sake of convenience. In the light emitting apparatus 1f shown in FIG. 24, the outward bending start point is not specifically limited. For example, as shown in FIG. 25, in the case where the bending start point is positioned at a point that is lower by the thickness of the external terminal 18 with respect to the upper surface of the light emitting apparatus 1f, a light emission surface 23 that is located on the upper surface of light emitting apparatus 1f can be arranged generally coplanar with the upper surface of the external terminal 18 to which the bent part 19 is attached. In this case, the connection positions between the first and second leads 74 and 75, and the external terminal 18 can be higher than the attachment positions between the first and second leads 74 and 75, and the heat dissipation member 20. As a result, the whole light emitting apparatus can be hidden under an installation base board except the light emission surface 23. Therefore, the installation base board can be efficiently used as a reflection member.

Fourth Embodiment

Figure 26:
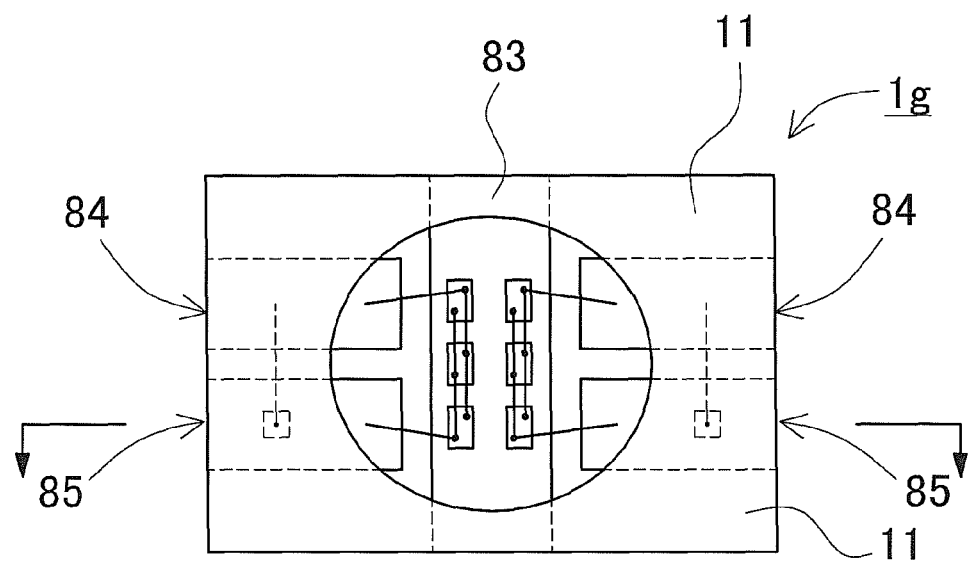
FIG. 26 is a plan view schematically showing a light emitting apparatus according to a fourth embodiment.
Figure 27:
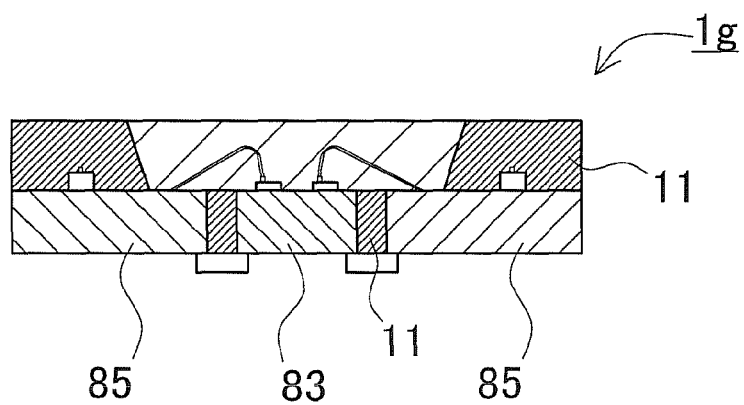
FIG. 27 is a cross-sectional view schematically showing the light emitting apparatus according to the fourth embodiment.

FIG. 26 is a plan view schematically showing a light emitting apparatus 1g according to a fourth embodiment. FIG. 27 is a cross-sectional view schematically showing the light emitting apparatus 1g. Members that are configured similarly to the members of the light emitting apparatus 1 according to the first embodiment are attached with the same reference numerals as the corresponding members of the light emitting apparatus 1, and their description is omitted for sake of brevity. In the light emitting apparatus 1g shown in FIGS. 26 and 27, a base 83, and first and second leads 84 and 85 do not protrude outward of the first resin molding member 11. The base 83, and the first and second leads 84 and 85 are covered by and accommodated in the first resin molding member 11. Accordingly, the light emitting apparatus 1g can be small. As shown in FIG. 27, the back surfaces of the first and second leads 84 and 85 are at least partially exposed. The exposed portions can provide electrical connection similarly to the first embodiment. The base 83, the first lead 84, and the second lead 85 can have a generally rectangular shape in a plan view from the light main surface side. Also, the base 83, the first lead 84, and the second lead 85 can have a shape that has protruding and recessed parts similar to the second embodiment, or a three-dimensional shape. In the light emitting apparatus 1g shown in FIG. 27, a plate that is thick in the thickness direction is used for the base 83, the first lead 84, and the second lead 85. However, a thin plate can be used. The leads can be bent similarly to the second embodiment.

Fifth Embodiment

Figure 28:
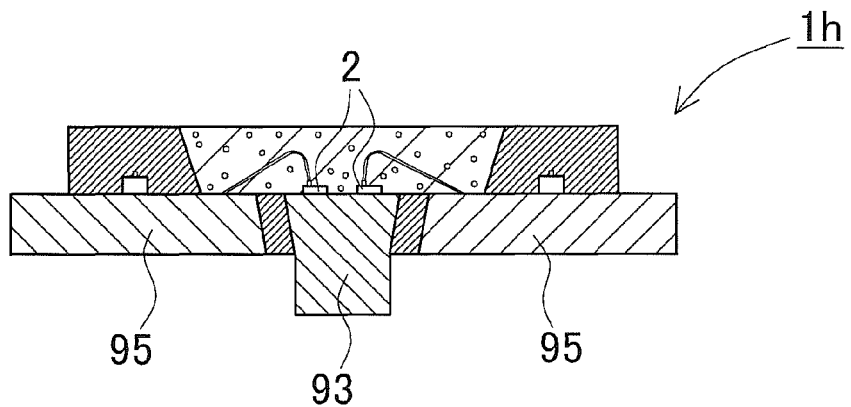
FIG. 28 is a cross-sectional view schematically showing a light emitting apparatus according to a fifth embodiment.

In the first embodiment, the base 2, and the first and second leads 4 and 5 have generally the same thickness, and the upper or back surfaces of the base 2, the first and second leads 4 and 5 are arranged generally coplanar with each other. However, the base, the first and second leads can have different thicknesses. FIG. 28 is a cross-sectional view schematically showing a light emitting apparatus 1h according to a fifth embodiment as an exemplary light emitting apparatus that has a base, first and second leads with different thicknesses. In the light emitting apparatus 1h, the upper surface of a base 93 is arranged generally coplanar with the upper surfaces of first and second leads 94 and 95. The back surface of the base 93 protrudes outward of the light emitting apparatus (downward in FIG. 28) relative to the back surfaces of the first and second leads 94 and 95. Accordingly, the light emitting apparatus can be easily installed to a separate base member in some cases. In addition to this, the externally exposed area of the base 93 is increased. Therefore, it is possible to improve a heat dissipation effect. The light emitting devices 2, which can be heat sources, are mounted on the base 93. In particular, for this reason, in the case where a high cooling effect is provided for the base 93 that is located directly under the devices, it is possible to increase electric power that is applied to the devices.

As shown in FIG. 28, the shape of the base 93 can have a rectangular shape or generally Y-shape in cross-section. That is, in the case where the width of the base 93 is getting narrower from the upper surface side toward the lower side of the light emitting device 2, the mount area of the base 93 for the devices is maintained. Accordingly, without reduction of the number of the light emitting devices that can be mounted, according to the reduction amount of the width of the base 93 on the lower side, it is possible to reduce the size of the apparatus as a whole. However, it is preferable that, as shown in FIG. 28, the base extends so that the width of the base in the protruding portion is constant or is getting wider toward the lower side, in order to increase the externally exposed area of the base. In this case, the light emitting apparatus 1h can be small, and additionally a heat dissipation effect can be improved. In the case where the width of the base 93 is not constant, the shapes of the first and second leads 94 and 95 are not specifically limited as long as the first and second leads 94 and 95 are electrically insulated from the base 93. However, in this case, for example, as shown in FIG. 28, the first and second leads 94 and 95 can have side surfaces with shapes that correspond to the side surface of the base 3 so that the side surfaces of the first and second leads 94 and 95 are parallel to the side surface of the base 3.

Figure 29:
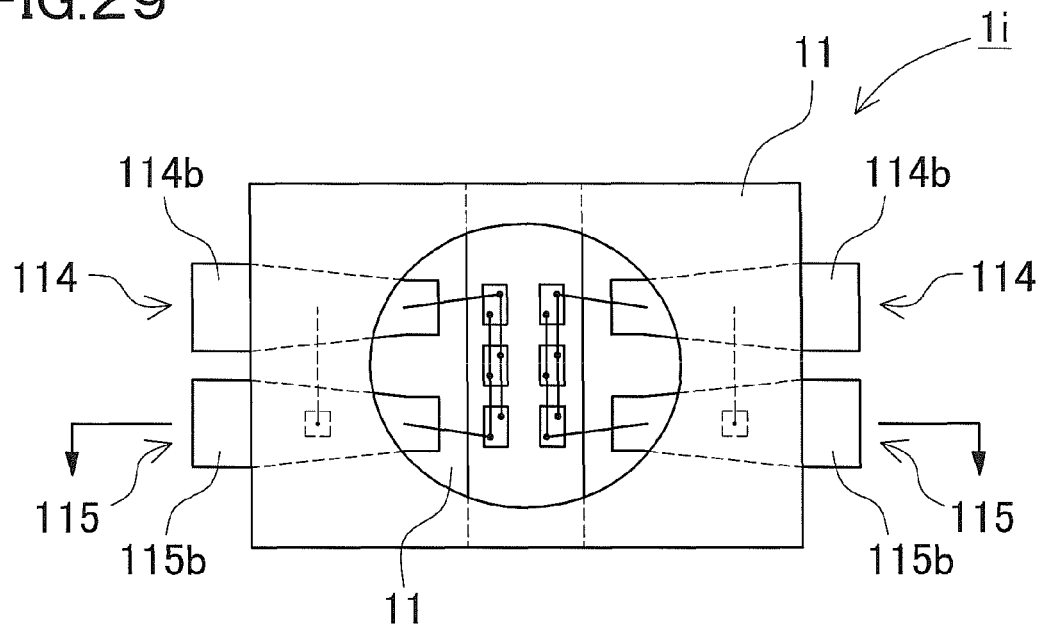
FIG. 29 is a plan view schematically showing another light emitting apparatus according to the fifth embodiment.

First and second leads 114 and 115 can be formed in various shapes. In a light emitting apparatus 11 shown in FIG. 29, the width of the first lead 114 and the second lead 115 is getting wider from the interior side toward the exterior side of the first resin molding member 11 in a plan view from the light outgoing surface side, that is, from the interior side toward externally exposed first and second outer lead portions 114b and 115b. Accordingly, it is possible to improve the self-alignment characteristics of the light emitting apparatus when installed by soldering.

Sixth Embodiment

Figure 30:
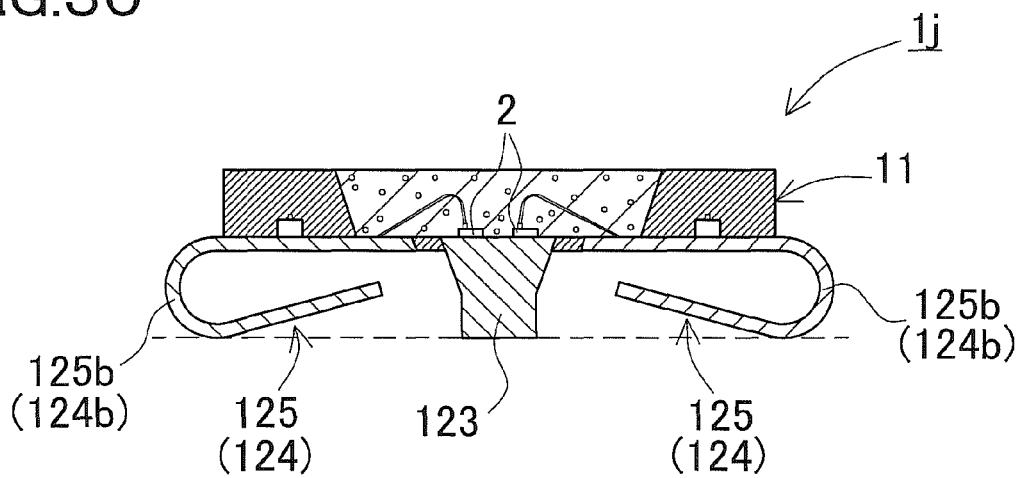
FIG. 30 is a cross-sectional view schematically showing a light emitting apparatus according to a sixth embodiment.
Figure 31:
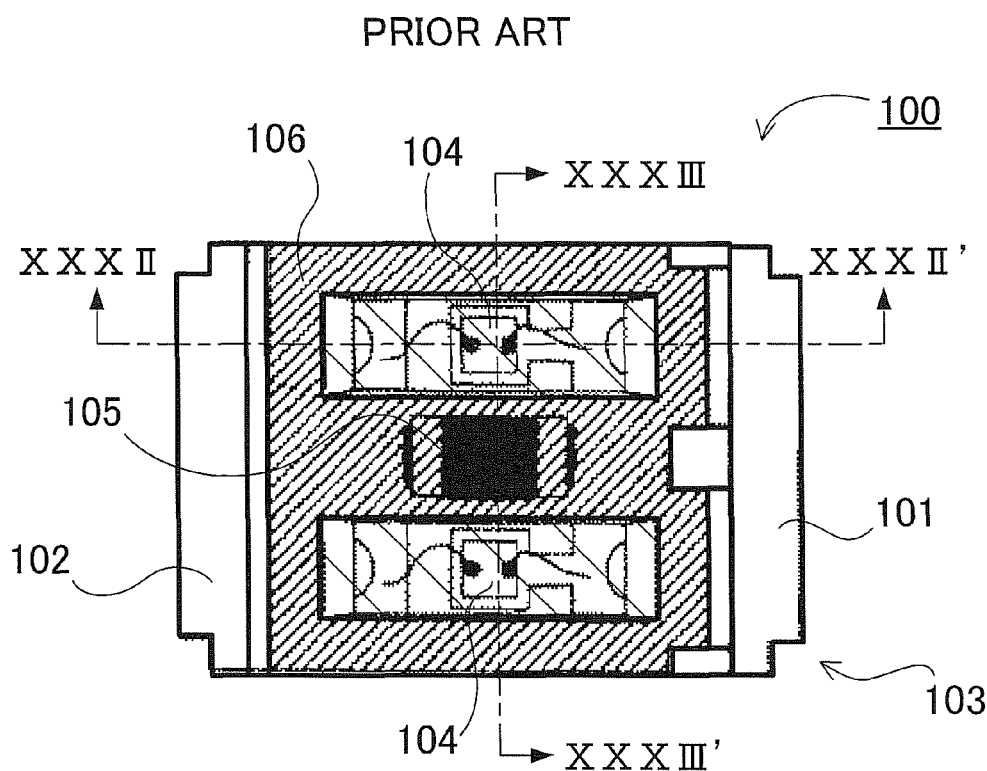
FIG. 31 is a cross-sectional view showing a conventional light emitting apparatus.
Figure 32:
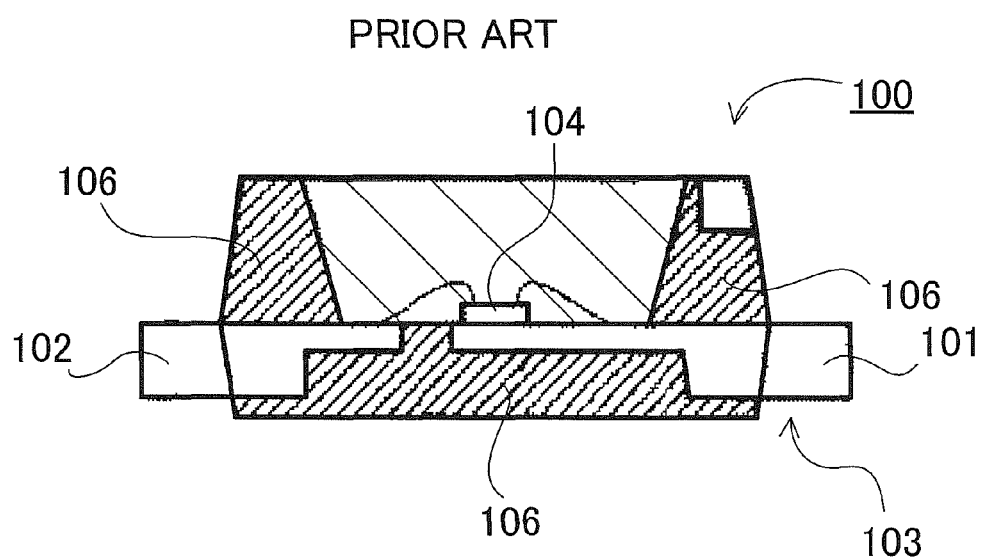
FIG. 32 is a cross-sectional view of the conventional light emitting apparatus shown in FIG. 31 taken along the line XXXII-XXXII'.
Figure 33:
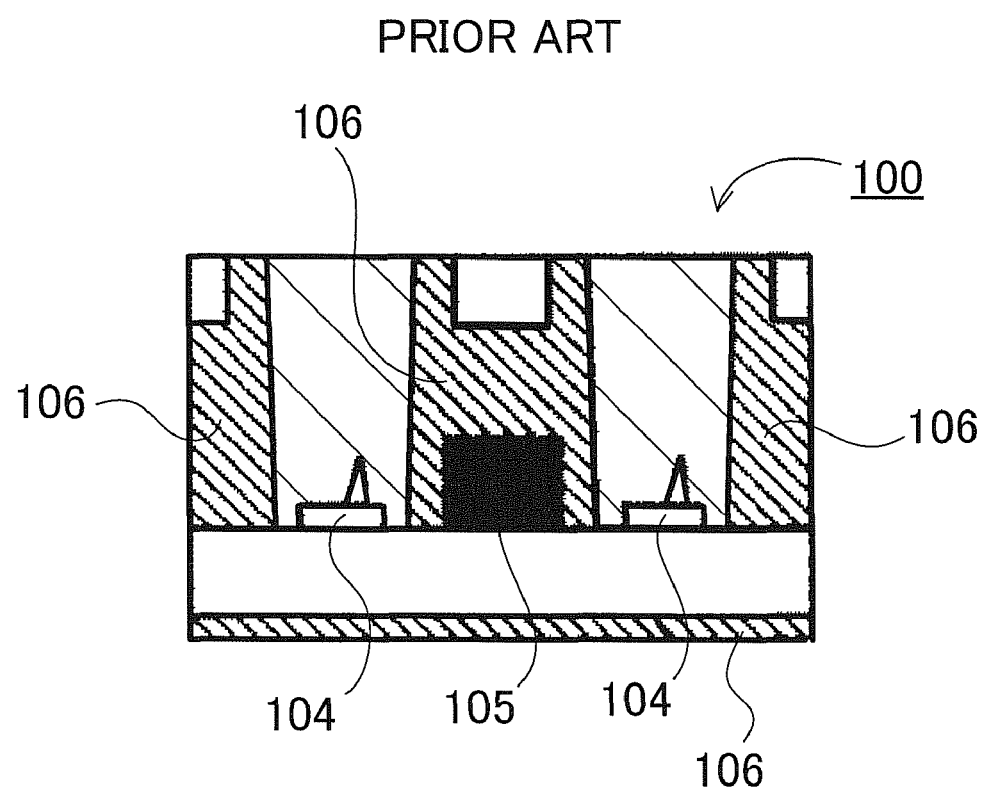
FIG. 33 is a cross-sectional view of the conventional light emitting apparatus shown in FIG. 31 taken along the line XXXIII-XXXIII'.

FIG. 30 shows a light emitting apparatus 1j that has bent first and second leads in the case of the light emitting apparatus that has the base 93 that protrudes downward as shown in FIG. 28. Members that are configured similarly to the members of the light emitting apparatus 1 according to the first or fifth embodiment are attached with the same reference numerals as the corresponding members of the light emitting apparatus 1, and their description is omitted for the sake of brevity. Outer lead portions 124b and 125b of first and second leads 124 and 125 protrude outward of the first resin molding member 11. The protruding outer lead portions 124b and 125b are bent toward the bottom surface side of the light emitting apparatus 1j so that the first and second leads 124 and 125 are generally folded in a U-shape as shown in FIG. 30. Accordingly, the areas of electrical connection parts can be large. In addition to this, cut-off parts may be formed at predetermined bending positions in the first and second leads 124 and 125. In this case, the first and second leads 124 and 125 can be easily bent.

The first and second leads 124 and 125 are bent to be located in the height of the base 123 that protrudes downward. The lowest surfaces of bent portions of the leads 124 and 125 are arranged generally coplanar with the bottom surface of the base 123 (dashed line in FIG. 30). Accordingly, when the light emitting apparatus 1j is installed, the light emitting apparatus 1j can be attached onto a separate base member at a plurality of positions of the bottom surfaces of the leads 124 and 125, and the base 123. Therefore, it is possible to increase the attachment area between the light emitting apparatus 1j and the base member. Consequently, it is possible to improve the stability of installation.

INDUSTRIAL APPLICABILITY

A resin molding device, and a light emitting apparatus that includes the resin molding member according to the embodiment of the present invention can be suitably used for lighting, a display, a back light for mobile phones, a flashlight for cameras, an accessory light for video cameras, and other conventional consumer-oriented light sources.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting apparatus comprising:
    a light emitting device;
    a base that is provided with the light emitting device mounted thereon;
    a first lead and a second lead that are electrically connected to the light emitting device;
    a first resin molding member that is formed of resin that covers at least partially the base and the first lead and the second lead so that the first resin molding member is formed integrally with the base and the first lead and the second lead; and
    a second resin molding member that is in contact with at least a part of the first resin molding member and covers the light emitting device,
    wherein the first and second resin molding members are formed of a thermosetting resin material, wherein a recessed portion is formed in the first resin molding member on a light emitting device mount surface side of the base to open upward and to have a side surface, and wherein a protection device is mounted on the first lead or the second lead, and the protection device is covered by the first resin molding member.

2. The light emitting apparatus according to claim 1, wherein the light emitting device includes first and second electrodes, wherein the first lead includes a first inner lead portion that includes a connection part that is exposed in the bottom surface area of the recessed portion and is electrically connected to the first electrode of the light emitting device, and a first lead embedded part that is covered by the first resin molding member, and a first outer lead portion that extends from the first inner lead portion outward of the first resin molding member and is exposed externally of the first resin molding member, wherein the second lead includes a second inner lead portion that includes a connection part that is exposed in the bottom surface area of the recessed portion and is electrically connected to the second electrode of the light emitting device, and a second lead embedded part that is covered by the first resin molding member, and a second outer lead portion that extends from the second inner lead portion outward of the first resin molding member and is exposed externally of the first resin molding member.

3. The light emitting apparatus according to claim 1, wherein the base is at least partially exposed in the bottom surface area of the recessed portion in the first resin molding member, wherein the light emitting device is mounted in the exposed part of the base.

4. The light emitting apparatus according to claim 2, wherein the base and the connection parts of the first and second leads are spaced away and are insulated from each other.

5. The light emitting apparatus according to claim 1, wherein the base is at least partially exposed from the first resin molding member on a back surface of the base opposite to the mount surface on which the light emitting device is mounted.

6. The light emitting apparatus according to claim 5, wherein the first and second leads are at least partially exposed from the first resin molding member on back surfaces of the first and second leads opposite to mount surfaces of the first and second leads that are electrically connected to the light emitting device.

7. The light emitting apparatus according to claim 6, wherein at least two of the exposed portions of the back surfaces of the base and the first and second leads are arranged coplanar with each other.

8. The light emitting apparatus according to claim 6, wherein a thermally conductive heat dissipation member is at least partially coupled onto the exposed portions of the back surfaces of the base and the first and second leads.

9. The light emitting apparatus according to claim 1, wherein the first resin molding member is formed by transfer molding.

10. The light emitting apparatus according to claim 1, wherein the first resin molding member is formed of at least one material selected from the group consisting of epoxy resin, denatured epoxy resin, silicone resin, denatured silicone resin, acrylate resin, urethane resin, and polyimide resin.

11. The light emitting apparatus according to claim 1, wherein the first resin molding member contains at least one material selected from the group consisting of filler, diffusion material, pigment, fluorescent material, reflexive material, light shielding material, ultraviolet absorption material, antioxidant material, and mold release agent.

12. The light emitting apparatus according to claim 1, wherein the second resin molding member contains at least one material selected from the group consisting of filler, diffusion material, pigment, fluorescent material, reflexive material, ultraviolet absorption material, and antioxidant material.

* * * * *